(12) United States Patent  
Stanley

(10) Patent No.: US 6,392,542 B1
(45) Date of Patent: May 21, 2002

(54) OCCUPANT SENSOR

(75) Inventor: James G. Stanley, Novi, MI (US)

(73) Assignee: Automotive Systems Laboratory, Inc., Farmington Hills, MI (US)

( * ) Notice: Subject to any disclaimer, the term of this patent is extended or adjusted under 35 U.S.C. 154(b) by 0 days.

(21) Appl. No.: 09/614,086

(22) Filed: Jul. 11, 2000

Related U.S. Application Data

(63) Continuation-in-part of application No. 09/474,673, filed on Dec. 29, 1999, now Pat. No. 6,283,504, and a continuation-in-part of application No. 09/474,600, filed on Dec. 29, 1999.
(60) Provisional application No. 60/143,761, filed on Jul. 12, 1999, provisional application No. 60/144,161, filed on Jul. 15, 1999, and provisional application No. 60/207,536, filed on May 26, 2000.

(51) Int. Cl.$^7$ .............................................. G08B 13/26

(52) U.S. Cl. ........................ 340/561; 280/735; 340/562; 701/45

(58) Field of Search ................................. 340/561, 562, 340/573.1; 701/45; 280/735; 180/271; 307/10.1; 600/547

(56) References Cited

U.S. PATENT DOCUMENTS

| | | | |
|---|---|---|---|
| 3,111,608 A | 11/1963 | Boenning et al. | 361/179 |
| 3,177,481 A | 4/1965 | Joy et al. | 246/167 R |
| 3,237,105 A | 2/1966 | Kalmus | 340/562 |
| 3,324,848 A | 6/1967 | Domeier et al. | 600/535 |
| 3,439,358 A | 4/1969 | Salmons | 340/552 |
| 3,740,567 A | 6/1973 | Atkins | 340/573.1 |
| 3,806,867 A | 4/1974 | Quantz | 340/457.1 |
| 3,898,472 A | 8/1975 | Long | 340/562 X |

(List continued on next page.)

OTHER PUBLICATIONS

Fink, Donald G. and Beaty, H. W.; Standard Handbook for Electrical Engineers 12th ed., McGraw–Hill Book Co, 1987, pp. 3–57 through 3–65.
Smith, J.R.; "Field Mice: Extracting hand geometry from electric field measurements", IBM Systems Journal, vol. 35. NOS. 3&4, 1996.
Reference Data for Engineers: Radio, Electronics, Computer and Communications 7th edition, E.C. Jordon editor in chief, Howard W. Sams, 1985, pp. 12–3 through 12–12.
Jinno K.; Ofuji, M.; Saito, T.; Sekido, S.; "Occupant Sensing Utilizing Perturbation of Electric Fields", SAE 971051, Reprinted from: Anthropomorphic Dummies and Crash Instrumentation Sensors (SP–1261), SAE International Congress & Exposition, Detroit, MI Feb. 24–27, 1997.
H. Philipp, "The Charge Transfer Sensor", Sensors magazine, Nov., 1996.

Primary Examiner—Thomas Mullen
(74) Attorney, Agent, or Firm—Dinnin & Dunn, P.C.

(57) ABSTRACT

An electric field sensor (12) comprising at least one electrode (26) mountable within a seat (14) is operatively coupled to a sensing circuit (38), which applies an oscillating signal (28), comprising at least one frequency or at least one pulse, to at least one electrode (26) and generates a signal (32) responsive to at least one electric-field-influencing property of an object proximate to the electric field sensor (12). At least one frequency or pulse width of the applied signal (28) are adapted to be at most weakly responsive to a wetting condition of the seat (14). A method of sensing an occupant comprises placing at least one electrode (12) within a seat (14) of a motor vehicle (16), applying an oscillating signal (28) to at least one electrode, measuring (1112) the amplitude (1026) and phase (1038) of a signal (26) responsive to the at least one electrode (26), rotating (1116) the measured amplitude (1026) and phase (1038), compensating (1118) the rotated amplitude by a value responsive to the rotated phase, and comparing (1120) the compensated amplitude with a threshold.

40 Claims, 13 Drawing Sheets

U.S. PATENT DOCUMENTS

| | | | |
|---|---|---|---|
| 3,943,376 A | 3/1976 | Long | 307/116 |
| 4,008,712 A | 2/1977 | Nyboer | 600/547 |
| 4,300,116 A | 11/1981 | Stahovec | 340/904 |
| 4,430,645 A | 2/1984 | Eskandry et al. | 340/572 |
| 4,796,013 A | 1/1989 | Yasuda et al. | 340/562 |
| 4,831,279 A | 5/1989 | Ingraham | 307/116 |
| 4,833,393 A | 5/1989 | Wetzel | 324/678 |
| 4,887,024 A | 12/1989 | Sugiyama et al. | 324/674 |
| 4,911,175 A | 3/1990 | Shizgal | 600/547 |
| 4,947,862 A | 8/1990 | Kelly | 600/547 |
| 4,980,519 A | 12/1990 | Mathews | 178/19.01 |
| 5,071,160 A | 12/1991 | White et al. | 280/735 |
| 5,118,134 A | 6/1992 | Mattes et al. | 280/735 |
| 5,166,679 A | 11/1992 | Vranish et al. | 340/870.37 |
| 5,177,445 A | 1/1993 | Cross | 324/637 |
| 5,214,388 A | 5/1993 | Vranish et al. | 324/683 |
| 5,231,358 A | 7/1993 | Kapsokavathis et al. | 324/672 |
| 5,247,261 A | 9/1993 | Gershenfeld | 324/716 |
| 5,247,281 A | 9/1993 | Facon et al. | 340/562 |
| 5,363,051 A | 11/1994 | Jenstrom et al. | 324/661 |
| 5,372,141 A | 12/1994 | Gallup et al. | 600/547 |
| 5,436,613 A | 7/1995 | Ghosh et al. | 340/573.1 |
| 5,437,184 A | 8/1995 | Shillady | 73/304 C |
| 5,442,347 A | 8/1995 | Vranish | 340/870.37 |
| 5,446,391 A | 8/1995 | Aoki et al. | 324/661 |
| 5,469,364 A | 11/1995 | Hughey et al. | 324/676 X |
| 5,494,311 A | 2/1996 | Blackburn et al. | 280/735 |
| 5,525,843 A | 6/1996 | Howing | 307/9.1 |
| 5,539,292 A | 7/1996 | Vranish | 318/568.21 |
| 5,602,734 A | 2/1997 | Kithil | 701/45 |
| 5,612,876 A | 3/1997 | Zeidler et al. | 701/45 |
| 5,624,132 A | 4/1997 | Blackburn et al. | 280/735 |
| 5,654,643 A | 8/1997 | Bechtel et al. | 324/687 |
| 5,672,976 A | 9/1997 | Egger et al. | 324/668 |
| 5,691,693 A | 11/1997 | Kithil | 340/439 |
| 5,722,686 A | 3/1998 | Blackburn et al. | 280/735 |
| 5,724,024 A | 3/1998 | Sonderegger et al. | 340/562 |
| 5,730,165 A | 3/1998 | Philipp | 137/1 |
| 5,770,997 A | 6/1998 | Kleinberg et al. | 280/735 X |
| 5,793,176 A | 8/1998 | Novak | 318/587 |
| 5,802,479 A | 9/1998 | Kithill et al. | 701/45 |
| 5,844,415 A | 12/1998 | Gershenfeld et al. | 324/663 |
| 5,844,486 A | 12/1998 | Kithil et al. | 340/573.4 |
| 5,871,232 A | 2/1999 | White | 280/735 |
| 5,883,591 A | 3/1999 | McEwan | 342/22 |
| 5,914,610 A | 6/1999 | Gersenfeld et al. | 324/663 |
| 5,948,031 A | 9/1999 | Jinno et al. | 701/45 |
| 5,964,478 A | 10/1999 | Stanley et al. | 280/735 |
| 6,014,602 A | 1/2000 | Kithil et al. | 701/45 |
| 6,031,380 A | 2/2000 | Gleixner et al. | 324/683 |
| 6,043,743 A | 3/2000 | Saito et al. | 340/562 |
| 6,079,738 A | 6/2000 | Lotito et al. | 280/735 |
| 6,094,610 A | 7/2000 | Steffens, Jr. et al. | 701/45 |
| 6,158,768 A | 12/2000 | Steffens, Jr. et al. | 280/735 |
| 6,161,070 A * | 12/2000 | Jinno et al. | 701/45 |
| 6,186,538 B1 | 2/2001 | Hamada et al. | 280/735 |
| 6,208,249 B1 | 6/2001 | Saito et al. | 340/561 |
| 6,283,504 B1 * | 9/2001 | Stanley et al. | 280/735 |

* cited by examiner

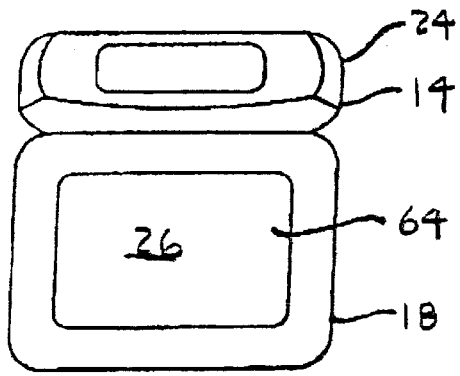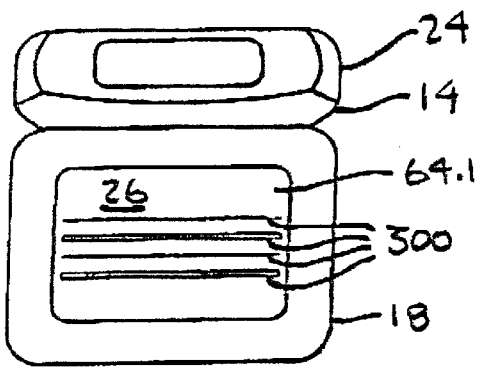
FIG. 3a.    FIG. 3b.
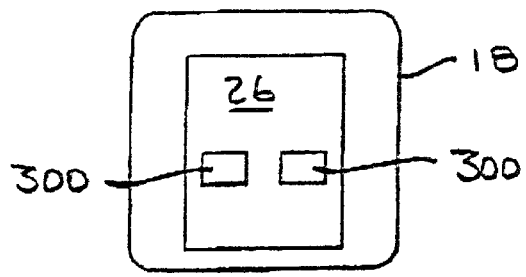
FIG. 4.
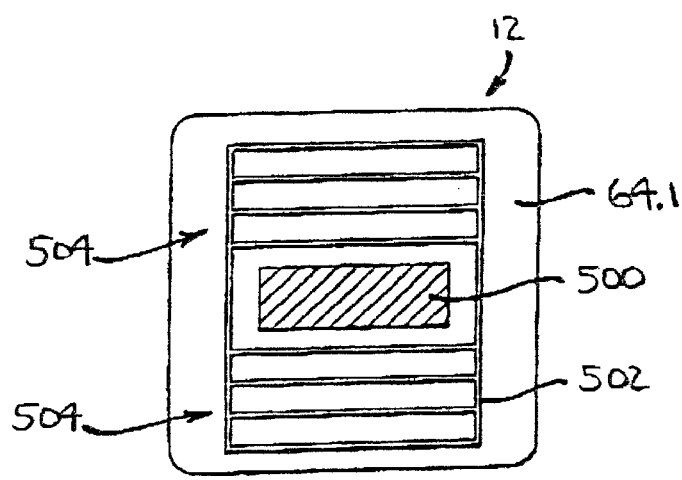
FIG. 5

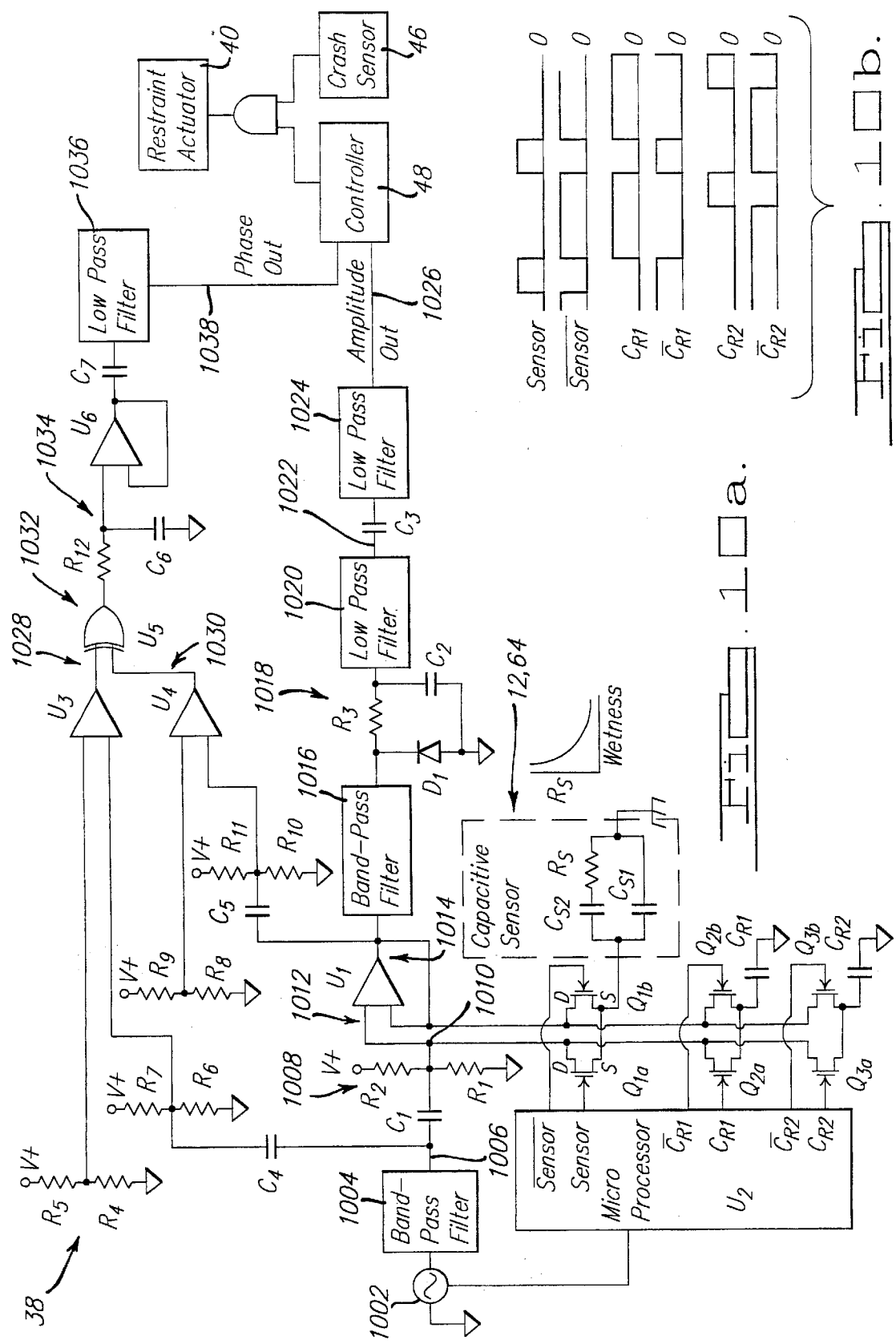

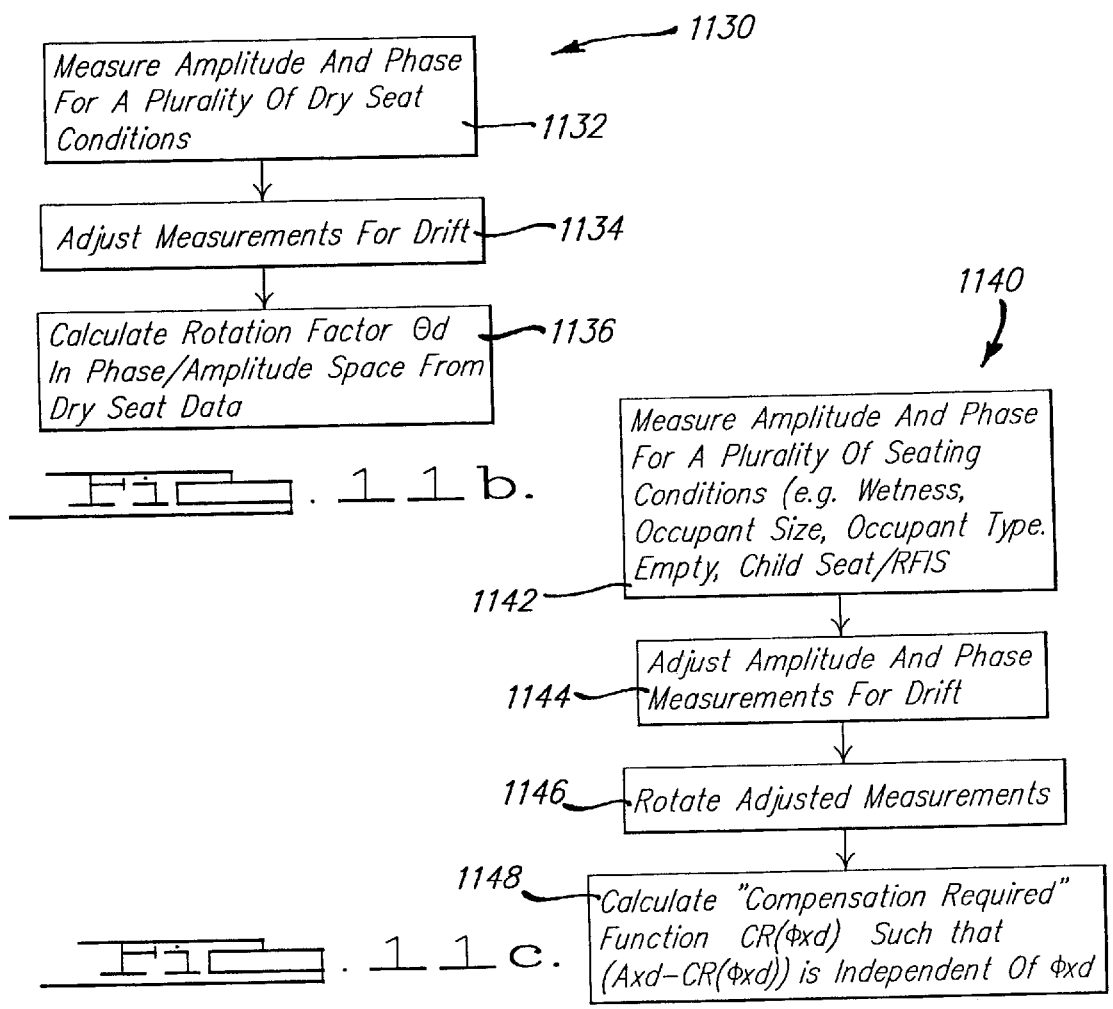
FIG. 11b.
FIG. 11c.
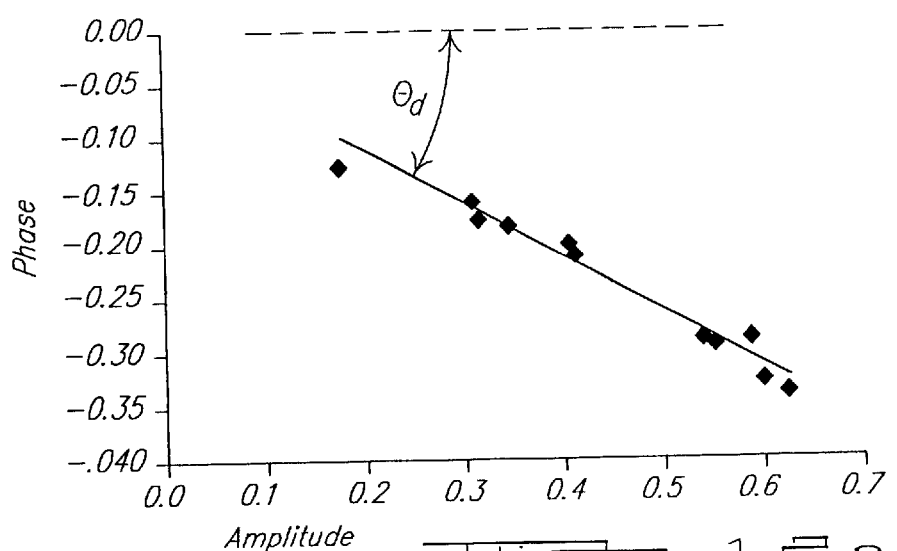
FIG. 12a.

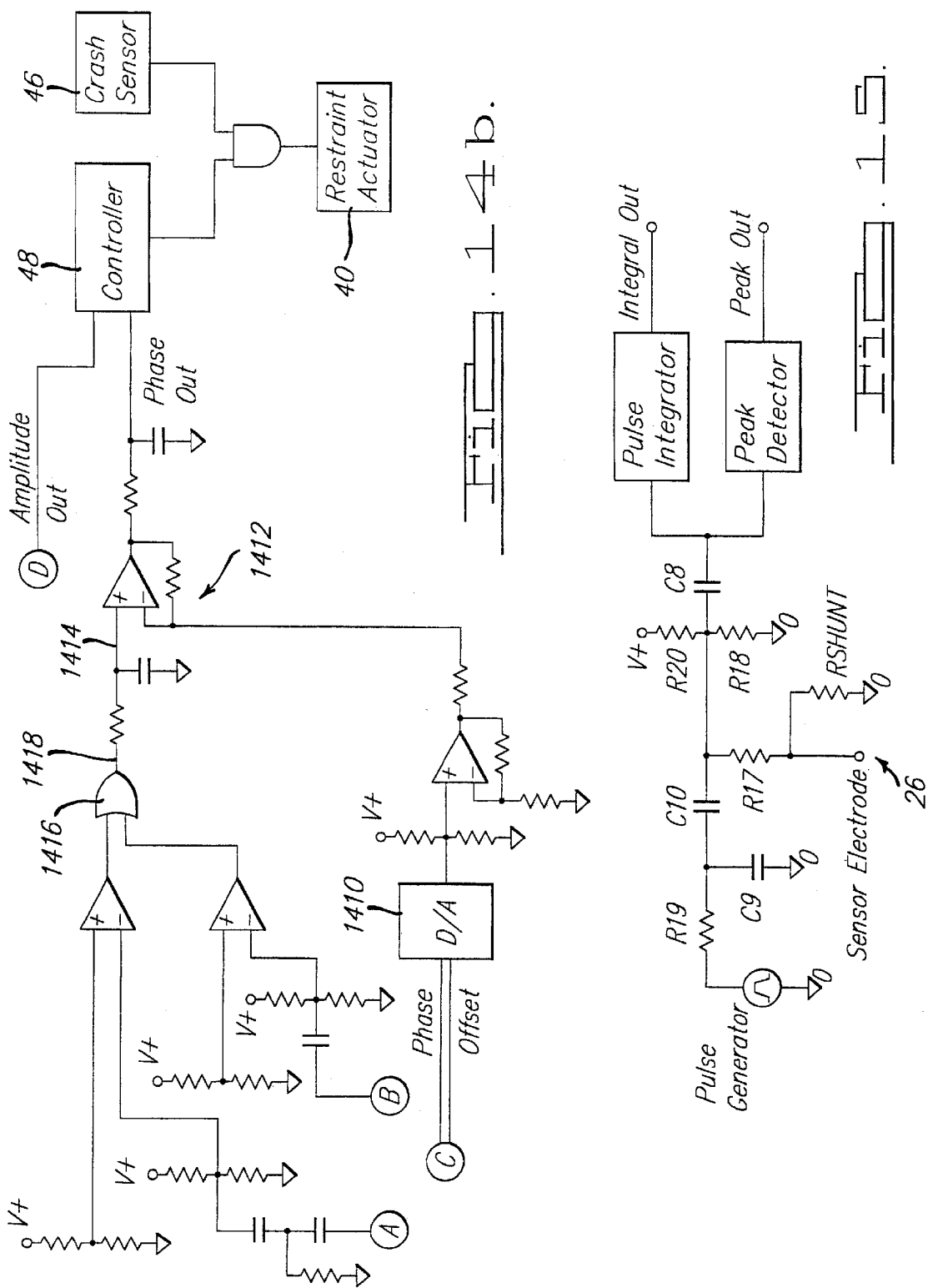

OCCUPANT SENSOR

CROSS-REFERENCE TO RELATED APPLICATIONS

The instant application claims the benefit of the following prior U.S. provisional applications: U.S. Provisional Application Ser. No. 60/143,761 filed on Jul. 12, 1999. ("ASL-236-PRO"); U,S. Provisional Application Ser. No. 60/144,161 filed on Jul. 15, 1999 ("ASL-237-PRO"); and U.S. Provisional Application Ser. No. 60/207,536 filed on May 26, 2000 ("ASL-263-PRO").

The instant application is a continuation-in-part of U.S. application Ser. No. 09/474,673 entitled "Occupant Detection System", filed on Dec. 29, 1999 ("ASL-258-US") now U.S. Pat No. 6,283,504.

The instant application is also a continuation-in-part of U.S. application Ser. No. 09/474,600 entitled Occupant Detection System, filed on Dec. 29, 1999 ("ASL-222-US").

The following, commonly owned U.S. applications also disclose occupant detection systems or occupant sensors: U.S. application Ser. No. 09/294,752 entitled Occupant Detection System, filed on Apr. 19, 1999 ("ASL-203-US"), now U.S. Pat. No. 6,220,627; U.S. application Ser. No. 09/294,675 entitled Occupant Detection System, filed on Apr. 19, 1999 ("ASL-205-US") now U.S. Pat. No. 6,302,438; U.S. application Ser. No. 09/294,680 entitled Occupant Detection System, filed on Apr. 19, 1999 ("ASL-207-US") now U.S. Pat. No. 6,290,255; U.S. application Ser. No. 09/474,470, entitled Occupant Detection System, filed on Dec. 29, 1999 ("ASL-228-US"); U.S. application Ser. No. 09/474,473, entitled Occupant Detection System, filed on Dec. 29, 1999 ("ASL-257-US"); U.S. application Ser. No. 09/474,469, entitled Occupant Sensor, filed on Dec. 29, 1999 ("ASL-259-US"); U.S. application Ser. No. 09/520,866 entitled Proximity Sensor, filed on Mar. 6, 2000 ("ASL-225-US"); and U.S. application Ser. No. 09/568,596 entitled "Occupant Detection System", filed on May 10, 2000 ("ASL-234-US").

BRIEF DESCRIPTION OF THE DRAWINGS

The above-identified applications are incorporated herein by reference.

In the accompanying drawings:

FIGS. 3a and 3b illustrate several electrode embodiments in accordance with the instant invention;

FIG. 4 illustrates another electrode embodiment in accordance with the instant invention;

FIG. 5 illustrates yet another electrode embodiment in accordance with the instant invention.

FIG. 10a illustrates a schematic diagram of another embodiment of a circuit for providing both amplitude and phase information from an electric field sensor;

FIG. 10b illustrates the operation of various elements of the sensing circuit of FIG. 10a;

FIG. 11b illustrates a flow chart of a process of calculating a rotation factor from amplitude and phase measurements from an electric field sensor for dry seat conditions;

FIG. 11c illustrates a flow chart of a process of calculating a compensation function from amplitude and phase measurements from an electric field sensor;

FIG. 12a is a plot of phase vs. amplitude for measurements from an electric field sensor for dry seat conditions, illustrating a rotation angle for adjusting subsequent measurements from the electric field sensor;

FIGS. 14a and 14b illustrate a schematic diagram of yet another embodiment of a circuit for providing both amplitude and phase information from an electric field sensor;

FIG. 15 illustrates a schematic diagram of an embodiment of a circuit for providing both integral and peak information from an electric field sensor using pulse excitation;

FIG. 16 illustrates a schematic diagram of another embodiment of a circuit for providing both integral and peak information from an electric field sensor using pulse excitation.

DESCRIPTION OF EMBODIMENT(S)

Figure 1:
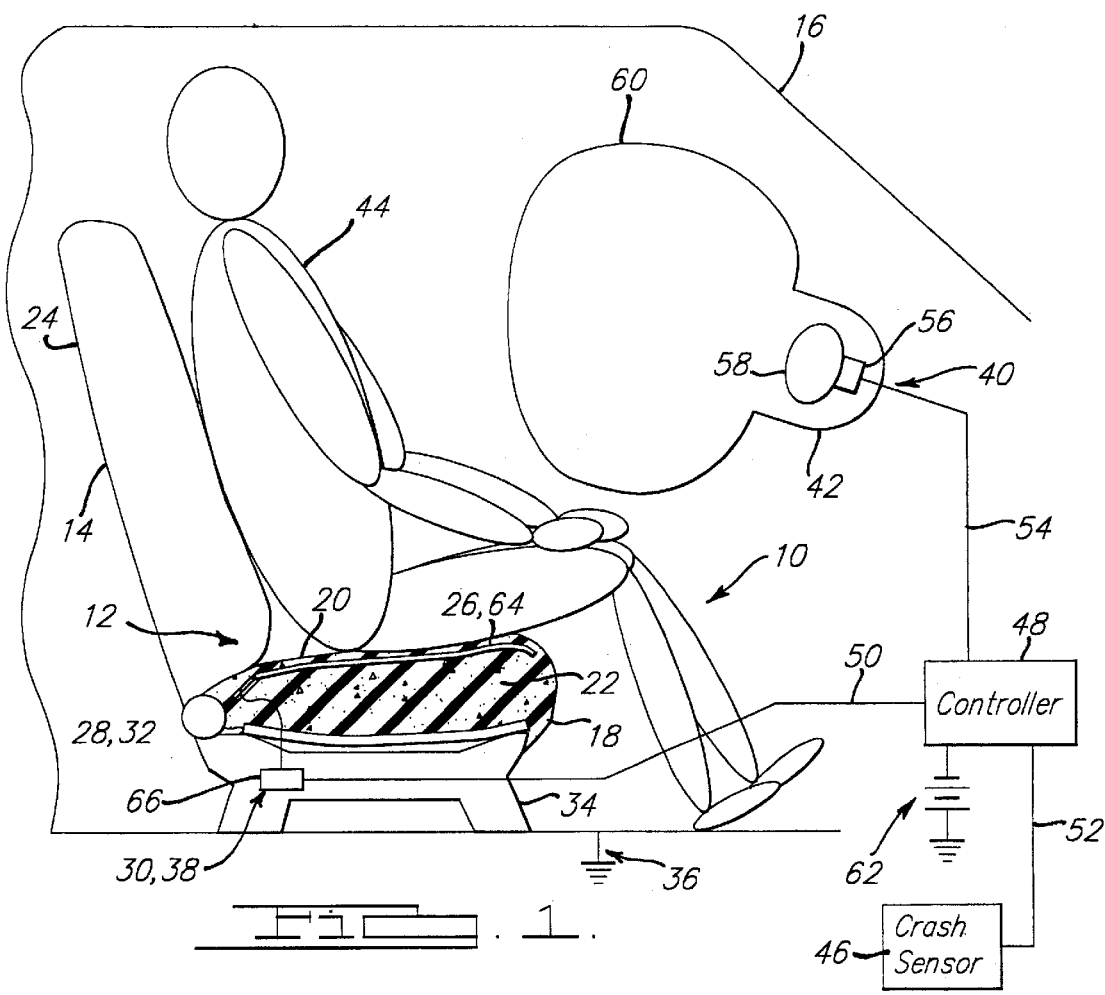
FIG. 1 illustrates an embodiment of the instant invention.

Referring to FIG. 1, an occupant sensor 10 comprises an electric field sensor 12 for detecting an occupant on a seat 14 of a motor vehicle 16. The electric field sensor 12 is, for example, placed in the seat bottom 18 under a seat cover 20 and close to the top of a foam cushion 22, but may be located elsewhere, for example in the seat back 24, for other occupant sensing applications.

As used herein, the term "electric field sensor" refers to a sensor that generates a signal responsive to the influence of that being sensed, upon an electric field. Generally, an electric field sensor comprises at least one electrode to which is applied at least one applied signal; and at least one electrode—which could be the same electrode or electrodes to which the applied signal is applied—at which a received signal (or response) is measured. The applied signal generates an electric field from the at least one electrode to a ground in the environment of the at least one electrode, or to another at least one electrode. The applied and received signals can be associated with the same electrode or electrodes, or with different electrodes. The particular electric field associated with a given electrode or set of electrodes is dependent upon the nature and geometry of the electrode or set of electrodes and upon the nature of the surroundings thereto, for example the dielectric properties of the surroundings. For a fixed electrode geometry, the received signal or signals of an electric field sensor are responsive to the applied signal or signals and to the nature of the environment influencing the resulting electric field, for example to the presence and location of an object with a permittivity or conductivity different from that of its surroundings.

One form of electric field sensor is a capacitive sensor, wherein the capacitance of one or more electrodes is measured—from the relationship between received and applied signals—for a given electrode configuration. The technical paper "Field mice: Extracting hand geometry from electric field measurements" by J. R. Smith, published in IBM Systems Journal, Vol. 35, Nos. 3&4, 1996, pp. 587–608, incorporated herein by reference, describes the concept of electric field sensing as used for making non-contact three-dimensional position measurements, and more particularly for sensing the position of a human hand for purposes of providing three dimensional positional inputs to a computer. What has commonly been referred to as capacitive sensing actually comprises the distinct mechanisms of what the author refers to as "loading mode", "shunt mode", and "transmit mode" which correspond to various possible electric current pathways. In the shunt mode, a voltage oscillating at low frequency is applied to a transmit electrode, and the displacement current induced at a receive electrode is measured with a current amplifier, whereby the displacement current may be modified by the body being sensed. In the "loading mode", the object to be sensed modifies the capacitance of a transmit electrode relative to ground. In the transmit mode, the transmit electrode is put in contact with the user's body, which then becomes a transmitter relative to a receiver, either by direct electrical connection or via capacitive coupling.

Accordingly, the electric field sensor 12 is either what is commonly known as a capacitive sensor, or more generally an electric field sensor operating in any of the above described modes. The electric field sensor 12 comprises at least one first electrode 26 operatively coupled to at least one first applied signal 28 so as to generate an electric field proximate to the at least one first electrode 26 responsive to the first applied signal 28. The first applied signal 28 for example comprises either an oscillating or pulsed signal. At least one first electrode 26 is operatively coupled to a receiver 30 which outputs at least one received signal 32 responsive to the electric field at the corresponding first electrode 26, wherein the received signal 32 is responsive to at least one electric-field-influencing property—for example dielectric constant, conductivity, size, mass or distance—of an object proximate to the electric field sensor 12. For example, for the electric field sensor 12 as a capacitance sensor, the receiver 30 measures the capacitance of at least one first electrode 26 with respect to either another first electrode 26 or with respect to a surrounding ground, for example a seat frame 34 of the seat 14, connected to circuit ground 36. The at least one first applied signal 28 is, for example, generated by a sensing circuit 38 which also contains the receiver 30. The sensing circuit 38 and associated at least one first applied signal 28 are adapted to be responsive to the influence of a water soaked seat 14, on measurements from the electric field sensor 12.

The electric field sensor 12 generates an electric field from the first applied signal 28 applied to at least one first electrode 26 and senses objects proximate to the associated at least one first electrode 26, for example in the seat bottom 18 of a seat 14, from the influence of the electric field on the received signal 32. The at least one first electrode 26 of the electric field sensor 12, the first applied signal 28 applied thereto, and the sensitivity of the receiver 30 are all adapted so that the electric field sensor 12 is, for example, substantially non-responsive to objects that are more than 50 mm above the seat bottom 18, but is substantially responsive to occupants that are normally seated directly on the seat 14.

The at least one first electrode 26 may shaped and located so as to be able to distinguish seating conditions for which a restraint actuator 40, for example an air bag inflator module 42, should be deployed from seating conditions for which the restraint actuator 40 should not be deployed so as to avoid causing more injury to an occupant 44 than the occupant 44 would otherwise incur without the deployment of the restraint actuator 40.

For example, the first electrode 26 is shaped and located so that a capacitance of the at least one first electrode 26 with respect to a circuit ground 36 is substantially greater for a seating condition for which the restraint actuator 40 should be deployed, for example an occupant 44 seated in substantially normal seating position on the seat 14 or a large body immediately above the seat bottom 18; than for a seating condition for which the restraint actuator 40 should not be deployed, for example an empty seat 14, an infant, child, or booster seat on the seat 14 with or without an infant or child seated therein, or an occupant 44 on the seat 14 in a position that is substantially different from a normal seating position. The at least one first electrode 26 is, for example, substantially the same size as a region to be sensed on the seat 14, and sections of the at least one first electrode 26 may be removed to selectively reduce the sensitivity thereof proximate to regions where an infant or child, in an infant, child, or booster seat, is closest to the seat 14.

Stated in another way, the electric field sensor 12 has a relatively short range and principally senses an occupant 44 when a large surface of the occupant is relatively close to the sensor. Occupants normally seated directly on the seat cover typically have a large surface of their body relatively close to the sensor. When infants or children are in child seats, most of their body is elevated several inches off the seat bottom surface, resulting in a relatively small influence upon the electric field sensor 12. The electric field sensor 12 in the seat bottom 18 distinguishes between a large body immediately above the seat cover 20—for example a normally seated, forward facing occupant in the seat—and an infant or child seat—including rear facing, front facing and booster seats—located on a passenger seat 14. When the seat 14 contains a child seat (including RFIS, forward facing child seats and booster seats), or when the seat 14 is empty, no forward facing occupant is detected near to the seat bottom and, as a result, the electric field sensor 12 causes the restraint actuator 40 to be disabled.

An electrode of the electric field sensor 12 may be constructed in a variety of ways, and the method of construction is not considered limiting. For example, an electrode may be constructed using rigid circuit board or a flexible circuit using known printed circuit board techniques such as etching or deposition of conductive materials applied to a dielectric substrate. Alternately, an electrode may comprise a discrete conductor, such as a conductive film, sheet or mesh that is distinct from or an integral part of the seat 14 or components thereof. The assembly of one or more electrodes together with the associated substrate is sometimes referred to as a sensing pad or a capacitive sensing pad.

In an exemplary embodiment, the electric field sensor 12 comprises a capacitive sensing pad 64 connected to an electronics module 66 containing the sensing circuit 38 necessary to measure the capacitance of the capacitive sensing pad 64 relative to the circuit ground 36, or other measurement, responsive to the influence of an electric-field-influencing medium upon the electric field sensor 12. In operation, an occupant seated on the seat bottom 18 of seat 14 sufficiently increases the capacitance of the electric field sensor 12 so as to indicate the presence of the occupant. The capacitive sensing pad 64 is adapted so as to be substantially responsive to large objects, such as normally seated adults, on the seat bottom 18 for which an air bag restraint system would be beneficial in a crash, and to be substantially non-responsive to objects such as rear facing infant seats, child seats, and booster seats on the vehicle seat, for which an air bag restraint system would not be beneficial in a crash.

The electric field sensor 12 and a crash sensor 46 are operatively coupled to a controller 48, which operates in accordance with known analog, digital, or microprocessor circuitry and software to control the actuation of the restraint actuator 40 responsive to a first signal 50 from the electric field sensor 12, indicative of a seat occupancy scenario; and responsive to a second signal 52 from the crash sensor 46, indicative of a crash. For the example of a restraint actuator 40 comprising an air bag inflator module 42, responsive to a crash detected by the crash sensor 44, if an occupant 44 is seated on the seat 14, a third signal 54 generated by the controller 42 is operatively coupled to one or more initiators 56 of one or more gas generators 58 mounted in the air bag inflator module 42, thereby controlling the actuation of the air bag inflator module 42 so as to inflate an associated air bag 60 as necessary to protect the occupant 44 from injury which might otherwise be caused by the crash. The electrical power necessary to carry out these operations is provided by a source of power 62, for example, the vehicle battery. In another embodiment, the occupant sensor 10 may make the deployment enable/disable decision for the restraint actuator 40, and communicate this decision to the controller 48 for controlling the actuation of the restraint actuator 40. In yet another embodiment, the occupant sensor 10 may incorporate the crash sensor 46 and the elements of the controller 48 in a single module that controls the actuation of the restraint actuator 40 as described hereinabove.

Figure 2:
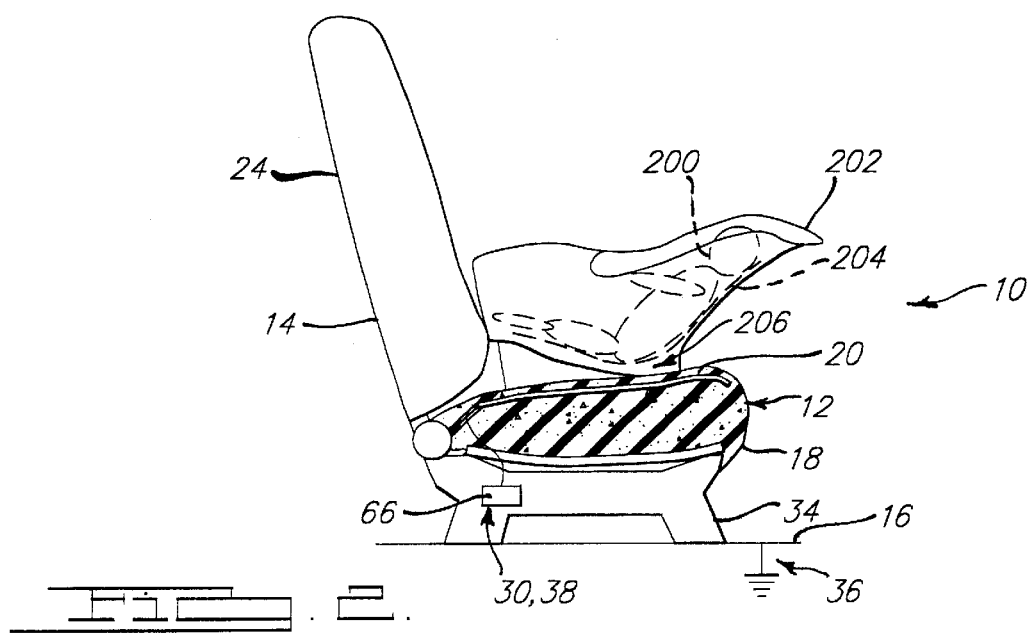
FIG. 2 illustrates a child in a typical rear facing infant seat placed on a vehicle seat.

Referring to FIG. 2, the occupant sensor 10 can be used to distinguish infants or children in rear facing infant seats, child seats or booster seats, from adults, on the basis that the child 200 therein does not have a large surface of its body very near to the seat bottom 18 and the at least one first electrode 26 contained therein. For example, for the electric field sensor 12 providing a signal responsive to the capacitance of at least one first electrode 26 thereof, a normally seated occupant provides a substantially larger increase in capacitance relative to an empty seat, than does a rear facing infant seat 202.

The occupant sensor 10 can discriminate a rear facing infant seat 202 (RFIS), or generally a child seat, from an adult because the child 200 in a rear facing infant seat 202 never has a large surface of its body very near to the seat bottom 18 and the at least one first electrode 26 contained therein. The seating contour 204 inside the rear facing infant seat 202 is such that the buttocks of the child 200 are closest to the seat bottom 18 of the seat 14. Usually there is a significant gap 206, up to several inches, between the child 200 and the seat bottom 18 of the seat 14. Since child seats are typically made of plastic, the seats themselves are not sensed directly by the electric field sensor 12. Even for a rear facing infant seat 202 for which the gap 206 between the child 200 and the seat bottom 18 of the seat 14 is relatively small, the inside seating contour 204 still creates a significant gap between the at least one first electrode 26 and all parts of the child 200 except the buttocks. Since only a small portion of the surface of the child 200 is near to the at least one first electrode 26, the capacitance measured by the electric field sensor 12 is relatively low, and more particularly, less than the threshold capacitance, $C_{norm}$ for detecting a normally seated occupant 44.

Referring to FIGS. 3a and 3b, the sensitivity to rear facing infant seats of an elementary capacitive sensing pad 64 comprising a continuous conductive sheet can be reduced by the modification shown in FIG. 3b, particularly for a rear facing infant seat 202 that leaves only a small gap 206 between the capacitive sensing pad 64.1 and the child 200. Referring to FIG. 3b, the portion of the child seat where the gap 206 is small, when the child seat is properly installed, is usually within a zone between 9 and 12 inches from the seat back 24 and across the entire seat bottom 18. The capacitive sensing pad 64.1 is adapted to make this zone less sensitive than the remaining portion of the capacitive sensing pad 64.1 by removing at least one region 300 of the at least one first electrode 26 within the area of greatest sensitivity. Accordingly, this increases the differentiation between a worst case signal for a rear facing infant seat 202 and the signal for a normally seated adult, Whereas, for example, rectangular slots are illustrated in FIG. 3b, one of ordinary skill in the art will recognize that the modification to the capacitive sensing pad 64.1 within the zone can be accomplished with a variety of geometries so as provide for a similar effect on the sensitivity pattern of the capacitive sensing pad 64.1. For example FIG. 4 illustrates a plurality of rectangular areas within which the conductor is removed from the at least one first electrode 26.

Alternately, an electric field sensor 12 with a similarly modified sensitivity can be constructed with a plurality of capacitive sensing pads 64 within the seat bottom 18, wherein a first capacitive sensing pad 64 only senses the zone where the gap 206 between the child and the sensor could be small, and a second capacitive sensing pad 64 senses the remaining portion of the seat bottom 18. If the total signal is relatively low and is dominated by the signal from the first capacitive sensing pad 64, then the corresponding object on the seat 14 is likely a rear facing infant seat 202.

Figure 6:
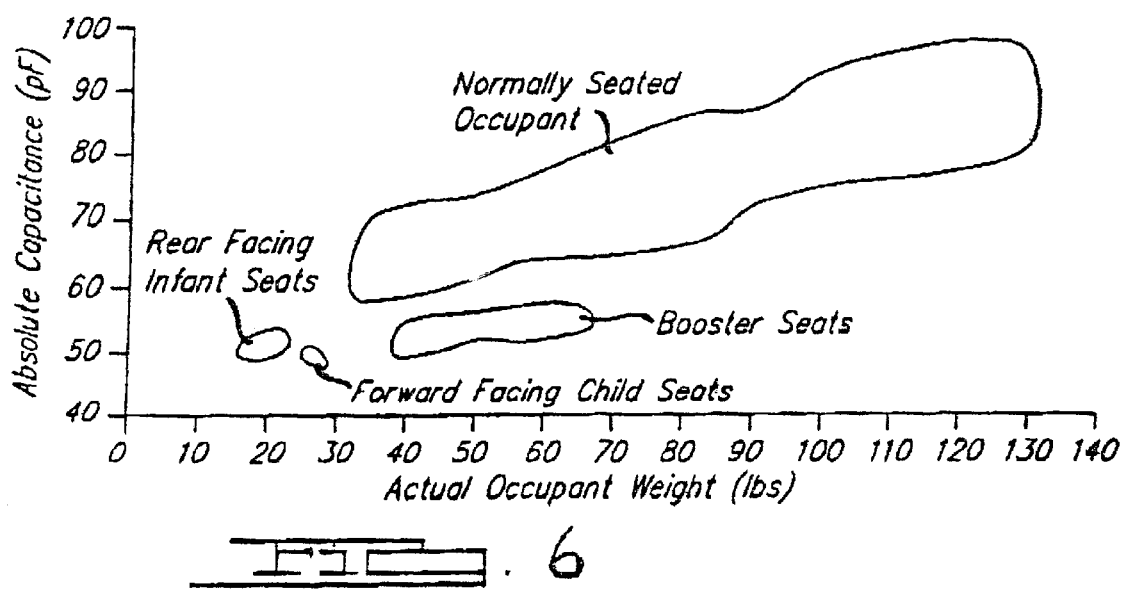
FIG. 6 illustrates the capacitance of an electric field sensor in accordance with FIG. 5 for a variety of seat occupancy scenarios and conditions.

Yet another embodiment with reduced sensitivity to child seats is illustrated in FIG. 5, wherein a ground plane 500 is located in the region of the electric field sensor 12 where, when mounted in the seat bottom 18, the gap 206 could be small between the seat bottom 18 and a child in a rear facing infant seat 202, so as to reduce the capacitance sensed when a rear facing infant seat 202 is located on the seat 14. Accordingly, the ground plane 500 substantially reduces the effect of any object immediately above the area of the ground plane 500, and precludes the need for a driven shield, described hereinbelow. The electric field sensor 12 illustrated in FIG. 5 further comprises strips 502 that are spaced apart in a lattice pattern 504. FIG. 6 shows results from tests of an electric field sensor 12 similar to that of FIG. 5, wherein the data was taken with human subjects seated either directly on the vehicle seat bottom or in a child seat.

The wetting of a seat 14 proximate to an electric field sensor 12 can have a significant effect on the capacitance of the electric field sensor 12 with respect to a circuit ground 36. The sensing circuit 38 is adapted to assess and compensate for the influence of a water soaked seat on the capacitance measured from the sensor by measuring the degree to which the water on or in the seat is influencing the capacitance measurement. If otherwise uncompensated, water on the seat can be a source of ambiguity, for example, causing a child in a rear facing infant seat 202 on a wet seat to be sensed as an adult. When the seat cover of a seat becomes wet, the capacitance measurement is affected by two mechanisms. First, the water itself has a high dielectric constant and increases the capacitive coupling from the sensor electrode to ground (or any other electrode), which increases the capacitance of the capacitive sensing pad 64, which increase the instant invention is substantially unable to compensate if the effect is purely capacitive. Second, the water increases the conductivity of the seat cover 20, so that if the wet seat cover 20 is across the capacitive sensing pad 64 and extends close to a grounding point on the motor vehicle 16 (i.e. seat frame 34 or a ground plane in the sensor) then the seat cover 20 can act like a grounded conductor, even when capacitively coupled to ground. Grounded conductors across the sensor can significantly increase the capacitive coupling to ground. This "grounded wet seat cover" effect can be substantially reduced if the sensor is operated at high frequencies.

This "grounded wet seat cover" effect can be reduced for small amounts of water on the seat cover if the sensor is operated at frequencies above approximately 400 kHz, because the wet seat does not conduct well at these frequencies. However, if the seat cover and the seat foam are substantially wet, the capacitive coupling to ground can be significantly increased even at frequencies well above 400 kHz. The influence of the water can be identified by recognizing that the increased coupling to ground is not purely capacitive (or reactive) in nature, but also includes resistive components. Accordingly, the instant invention measures the total coupling to ground, and forms a second measure that is indicative of the resistive components of the path to ground that correlates with the influence that the water in the seat has on the total coupling path to ground. In combination, the measurement of the total coupling to ground and the second measure indicating the influence of the water in the seat can be combined into a function that identifies the change in the coupling to ground as a result of the presence of the occupant on the seat. It is this latter coupling to ground caused by the occupant, and not the influence of the water on the seat, that is used to make an air bag deployment decision.

Accordingly, if the capacitance measurement is performed in such a way that objects that react relatively slowly to varying electric fields are not sensed, the grounded wet seat cover problem can be reduced. Slowly reacting objects include objects that need more than several hundred nanoseconds to fully respond to an electric field. Continuous wave measurement techniques can achieve this by operating at frequencies above approximately 1 Megahertz. Pulsed measurement techniques (i.e. charge transfer techniques) can achieve this by using pulses under approximately 250 nanoseconds long. The significant resistance across a wet seat cover reduces the grounded wet seat cover effect at frequencies above approximately 1 Megahertz.

The electric field sensor 12 operates at frequencies, or with pulse lengths, such that materials or objects that respond slowly—for example a wet seat cover with a conductive path to ground—will not be sensed. In a continuous wave (CW) system, the excitation signal comprises a continuous sinusoidal or square wave signal for determining the capacitance of the capacitive sensing pad 64. Typically, excitation frequencies used in continuous wave systems are above 1 MHz.

The use of multiple pulse lengths or multiple frequencies when making the capacitive sensing measurements can provide information to determine if the seat is wet. As suggested above, the wet seat cover can create a dramatic effect when measurements are made at low frequencies (i.e. 50 kHz). The wet seat cover can also have a much smaller influence at high frequencies. Both low frequency and high frequency measurements are reliable while the seat is dry. Thus measurements made at both high frequency and low frequency can give an indication of whether the seat is wet (i.e. if the high frequency capacitance measurement is significantly lower than the low frequency capacitance measurement, the seat is likely wet).

The wet seat cam also be identified using phase information from the sensor. The capacitive sensing pad 64 can be modeled as a pure capacitor to ground when the seat is dry and empty, or when the seat is dry with a person seated on the seat bottom. If this capacitor is appropriately placed in a circuit such that the phase shifts when the impedance to ground of the capacitive sensing pad 64 has a significant resistive component, the wet seat can be identified. Many such circuits are known, a simple example of which is a voltage divider circuit using a real capacitor in series with the sensor. The sensor's impedance to ground normally only has resistive components to ground when the seat is wet and there is current traveling through the seat cover or the seat foam. This wet seat identification can be used to modify the threshold on which the enable decision is based, or to modify the measurements relative to a fixed threshold.

If the seat cover and the seat foam are very wet, however, the capacitive coupling to ground can be dramatically increased at frequencies well above 400 kHz. The influence of the water can be identified by recognizing that the increased coupling to ground is not purely capacitive (or reactive) in nature, but also includes resistive components. Accordingly, the sensing circuit 38 measures the total coupling to ground, and, as a second measure, one or more resistive components of the path to ground.

The second measure is chosen to correlate with the influence that the water in the seat has on the total coupling path to ground. When both measures are taken, the measurement of the total coupling to ground and the measure which indicates the influence of the water in the seat can be combined into a function to identify the change in the coupling to ground because of the occupant on the seat. This coupling to ground caused by the occupant, and not the influence of the water on the seat, is principally used to make the deployment decision.

Figure 7:
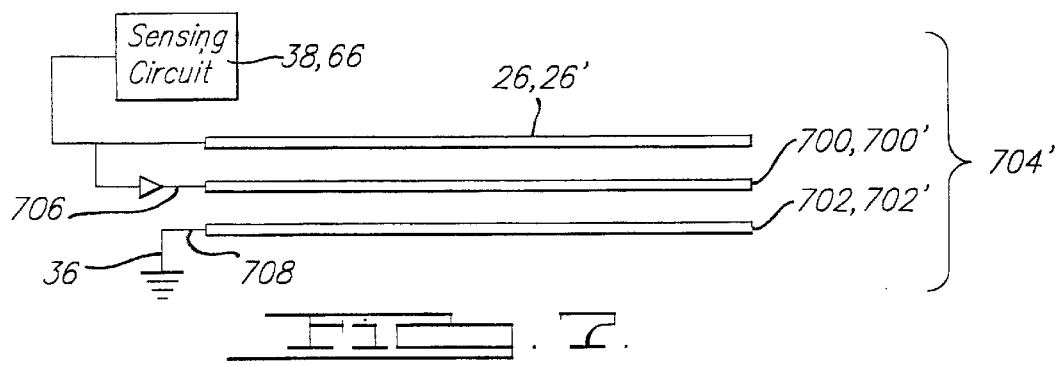
FIG. 7 illustrates a side-view of an embodiment of an electric field sensor incorporating a driven shield.

The electric field sensor 12 may be adapted to reduce the effect that liquids proximate to a first electrode 26 can have on the capacitance thereof with respect to a circuit ground 36, or with respect to another first electrode 26. For example, liquids spilled on and absorbed by the foam cushion 22 can increase the capacitance of the first electrode 26 with respect to the circuit ground 36. Referring to FIG. 7, the electric field sensor 12 can be adapted to reduce the effect of a wetting of the foam cushion 22 by incorporating a third electrode 700, known as a driven shield 700', and/or a fourth electrode 702, known as a ground plane 702', under the at least one first electrode 26, known as a sensing electrode 26', wherein the first 26, third 700 and fourth 702 electrodes are insulated from one another, for example by at least one dielectric substrate. For example, the first 26, third 700 and fourth 702 electrodes may be integrated so as to form a single capacitive sensing pad 704'. The driven shield 700' is a second conductor under the conductor of the sensing electrode 26' that is driven at the same potential as the sensing electrode 26', resulting in a cancellation of the electric field between the sensing electrode 26' and the driven shield 700'. The driven shield 700' substantially eliminates the sensing capability of the capacitive sensing pad 704' on the side of the sensing electrode 26' where the driven shield 700' is located. A ground plane 702' may be placed under the driven shield 700' so that the circuit driving the driven shield 700' drives a consistent load.

Accordingly, as so adapted, the electric field sensor 12 further comprises at least one third electrode 700 and at least one fourth electrode 702, wherein the at least one third electrode 700 is located between the at least one first electrode 26 and the at least one fourth electrode 702, and the at least one third electrode 700 is operatively coupled to a second applied signal 706. For example, the at least one third electrode 700 is substantially the same size as the at least one first electrode 26; the second applied signal 706 is substantially the same as the first applied signal 28; the at least one fourth electrode 702 is located between the at least one first electrode 26 and a foam cushion 22 of the seat 14; the at least one fourth electrode 702 is substantially the same size as the at least one first electrode 26; and the at least one fourth electrode 702 is operatively connected to a circuit ground 36, or to a third applied signal 708, wherein the third applied signal 708 is a circuit ground 36 potential.

The driven shield 700' and/or ground plane 702' are, for example, near to or slightly larger than the sensing electrode 26', and are provided to minimize the effects of liquid in the foam cushion 22 below the driven shield 700' and/or ground plane 702' on the capacitance of the sensing electrode 26', rather than to extend the range and sensitivity of the electric field sensor. The driven shield 700' and the sensing electrode 26' essentially covers the entire area to be sensed on the seat 14. Alternately, a plurality of first electrodes 26 can be distributed sparsely across the seat 14, thereby covering a smaller area than the entire area to be sensed on the seat 14. Each first electrode 26 can be embodied in a variety of sizes and shapes, and for a plurality of first electrodes 26, the arrangement thereof can be embodied in a variety of patterns.

In one embodiment, the at least one first electrode 26 comprises a plurality of first electrodes 26 operatively coupled to the receiver 30 so that different signals from different first electrodes 26 provide information associated with the distribution of an object on the seat 14, for example the seating location of an occupant 44 or the size of an occupant 44.

Figure 8:
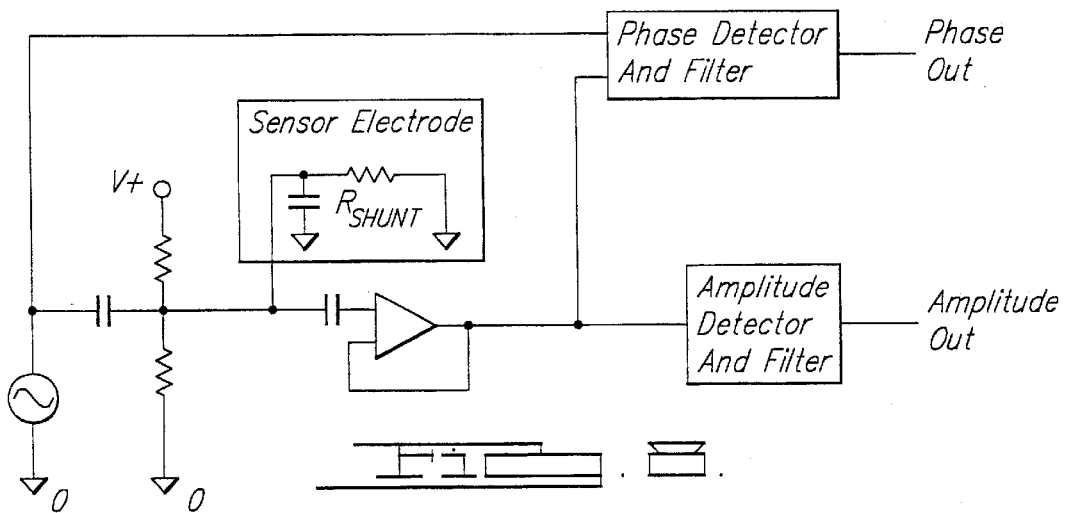
FIG. 8 illustrates a schematic diagram of an embodiment of a circuit for providing both amplitude and phase information from an electric field sensor.

An example of a circuit for making such measurements is illustrated in FIG. 8. The signal source drives a sinusoidal signal through a capacitive voltage divider. The resistors bias the voltage follower input and have a relatively high resistance compared to the impedance to ground through the sensor electrode at the chosen driving frequency. Accordingly, the amplitude of the signal at the voltage follower input depends on the total impedance from the sensor to ground. For dry seat conditions, this impedance is nearly completely capacitive in nature and thus there is a substantially constant, or known, phase difference or relationship between the input and the output. When the seat becomes wet, the coupling from the sensor to ground increases (e.g. the impedance to ground falls), which decreases the amplitude out. The coupling from the sensor to ground also changes from substantially capacitive (reactive) to a complex impedance with reactive and resistive components. The resistive component, shown in the schematic as $R_{SHUNT}$, causes the phase difference between the input and output to shift from its dry seat level. This phase difference shift can then be used to identify the influence the water in the seat is having on the amplitude measurement.

Figure 9:
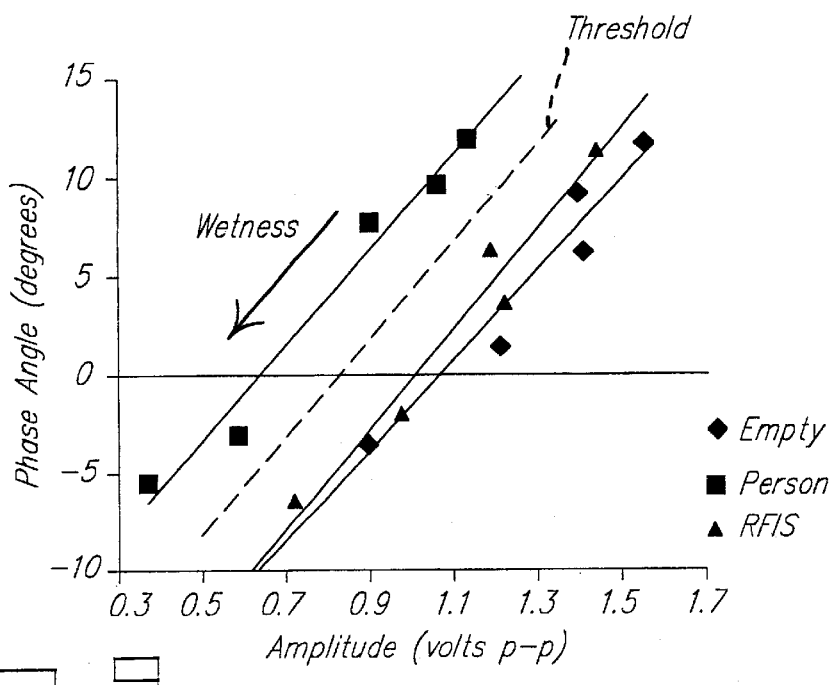
FIG. 9 illustrates a plot of phase angle vs. amplitude of an electric field sensor for a variety of seat occupancy scenarios and for varying degrees of wetness.

FIG. 9 illustrates the results from an electric field sensor 12 similar to that shown in FIG. 5 mounted in the seat of a vehicle for various seat occupancy scenarios under the following conditions:

1) a dry seat;
2) a wet towel on the seat;
3) a seat cover soaked with water;
4) a seat cover soaked with water, and with the seat foam moderately wet; and
5) both a seat cover and the seat foam soaked with water.

Using these results, it is possible to define a threshold for distinguishing those data points characteristic of a person on the seat from those data points characteristic of an empty seat or a rear facing infant seat (RFIS) on the seat. Stated in another way, if the amplitude and the phase are known, the person can be distinguished from the empty seat and the RFIS for the tested seat conditions. As illustrated by FIG. 9, both the amplitude and the phase vary with one another, i.e. are correlated, for both dry seat and wet seat situations. This was a characteristic of the measurement circuit of FIG. 8 used to gather the data of FIG. 9. The differentiation between the two sets of data points is dependent upon the frequency of the applied signal, which for the results of FIG. 9 was 2 MHz, The temperature range that is possible in an automotive environment can potentially adversely affect the sensing circuit 38, causing a drift in the "perceived" sensor reading. One simple way to combat this drift is to use a reference capacitor that can be switched into the measurement circuit in place of the sensing electrode. Because the reference capacitor can be selected such that its value is relatively stable over temperature, drift can be identified and this information can be used to alter a decision threshold. An alternative scheme is to always measure the difference between a reference capacitor and the sensor capacitance. A second "calibration" capacitor can then be switched in to take the place of the sensor to identify the measurement system gain. Using a reference capacitor and a calibration capacitor allows the system to continuously compensate for variations in the measurement circuit. Rather than attempting to measure the temperature and then make a correction, the reference and calibration capacitor are used to measure the current offset and gain of the measurement circuitry so that measurements are always consistent. Switching between the reference capacitor, the calibration capacitor, or a sensor can be done using a combination of FET's or an analog demultiplexor such as a CD4051 from Texas Instruments.

The capacitance of the capacitive sensing pad 64 relative to circuit ground 36 is relatively small, for example less than about 300 picofarads. The temperature range that is possible in an automotive environment can significantly affect the components of the sensing circuit 38, causing drift that can be erroneously interpreted as a measurement that could enable the restraint actuator 40 to be erroneously enabled by the controller 48. The effects of this drift can be mitigated by incorporating a temperature stable reference capacitor in the sensing circuit 38 that is switched in place of the at least one first electrode 26 so as to provide a means for making comparative capacitive measurements. Since the reference capacitor can be selected such that its value is very stable over temperature, drift can be identified and quantified, and this information can be used to alter a decision threshold, for example responsive to a drift in circuit elements of the sensing circuit 38 with respect to temperature or time.

Referring to FIG. 10*a*, illustrating an exemplary sensing circuit 38, an oscillator 1002 generates an oscillating signal, for example a sinusoidal signal, that is filtered by a first bandpass filter 1004 so as to create a first oscillating signal 1006. The first oscillating signal 1006 is applied to a capacitive voltage divider 1008 comprising capacitor C1, resistors R1 and R2, and one or more capacitive elements to be measured, selected from the group consisting of the capacitive sensing pad 64, comprising at least one first electrode 26, a first reference capacitor CR1, and a second reference capacitor CR2, wherein the capacitive elements to be measured are included or excluded responsive to the states of respective FET switches Q1*a*, Q1*b*, Q2*a*, Q2*b*, Q3*a*, and Q3*b*. Capacitor C1, resistors R1 and R2, and the FET switches Q1*a*, Q2*a*, and Q3*a* —that when active switch in the respective capacitive elements to be measured,—are all connected to one another at a first node 1010, which is connected to the input 1012 of a voltage follower U1. The output 1014 of the voltage follower U1 is operatively coupled to FET switches Q1*b*, Q2*b*, and Q3*b* that when active, switch out the respective capacitive elements so as to not be measured. The activation of the FET switch elements of FET switch pairs Q1*a* and Q1*b*, Q2*a* and Q2*b*, and Q3*a* and Q3*b* are respectively mutually exclusive. For example, if FET switch Q1*a* is activated, or closed, then FET switch Q1*b* is deactivated or open. A capacitive element being measured adds to the capacitance at the first node, thereby affecting the strength of the signal at the input 1012 to the voltage follower U1. A capacitive element not being measured is disconnected from the first node by its respective first FET switch element, and connected to the output 1014 of the voltage follower U1 by its respective second FET switch element, wherein, in accordance with the characteristics of the associated operational amplifier of the voltage follower U1, the output 1014 of the voltage follower U1 follows the signal of the first node without that respective capacitive element connected, and voltage follower U1 provides a current through the associated capacitive element through the second respective FET switch element. Moreover, when the respective second FET switch element is activated, the source and drain of the respective first FET switch element are separately coupled to the respective operational amplifier inputs, so that to each is applied the same potential, thereby eliminating the effect of the capacitance of the respective first FET switch on the capacitance measurement.

The output 1014 of the voltage follower U1 is then coupled to a second bandpass filter 1016 of the same pass band as the first bandpass filter 1004, the output of which is detected by a detector 1018 comprising diode D1, resistor R3 and capacitor C2, and filtered by a first low pass filter 1020. The output 1022 of the first low pass filter 1020 has a DC component corresponding to the capacitance at the first node 1010. This DC component is optionally filtered by an optional blocking capacitor C3, and the resulting signal is filtered by a second low pass filter 1024 to provide an amplitude signal 1026 representative of the amplitude of the oscillating signal at the first node 1010, which is related to the total capacitance at that location. The blocking capacitor C3 is adapted so as to provide for a transitory measurement of the amplitude signal 1026.

The first oscillating signal 1006 is also operatively coupled to a first comparator U3 that generates a first square wave signal 1028 with a duty cycle of, for example, about 50 percent. The output 1014 of the voltage follower U1 is also operatively coupled to a second comparator U4 that generates a second square wave signal 1030 with a duty cycle of, for example, about 50 percent. The first 1028 and second 1030 square wave signals are operatively coupled to a logical exclusive OR gate, which, for first 1028 and second 1030 square wave signals each of 50 percent duty cycle, provides a third square wave signal 1032 having a duty cycle that varies with the phase difference between the first oscillating signal 1006 and the output 1014 of the voltage follower U1, wherein the duty cycle varies between 0 and 100 percent as the phase difference varies between 0 and 180 degrees. The third square wave signal 1032 is filtered by a third low pass filter 1034, the output of which is buffered by voltage follower U6. A blocking capacitor C7 passes the AC component of the output from the voltage follower U6, which is filtered by a fourth low pass filter 1036, so as to provide a phase signal 1038 representative of the phase shift to the first oscillating signal 1006 caused by the elements that are operatively coupled to the first node 1010.

In operation, a microprocessor U2 controls the activation of FET switches Q1*a*, Q1*b*, Q2*a*, Q2*b*, Q3*a*, and Q3*b*, for example in accordance with the control logic illustrated in FIG. 10*b*. With the first reference capacitor CR1 switched in by microprocessor U2, i.e. with Q2*a* activated and Q1*b* deactivates, the controller measures a first amplitude and a first phase. Then with the second reference capacitor CR2 also switched in by microprocessor U2, the controller measures a second amplitude and a second phase corresponding to an incremental increase of capacitance at the first node by the capacitance of capacitor CR2. With this information, the controller can compute a sensitivity factor in Volts/picofarad from the amplitude measurements given the known values of capacitance of capacitors CR1 and CR2, and an associated sensitivity factor for phase from the phase measurements. Then, the microprocessor U2 switches out the first CR1 and second reference capacitor CR2, switches in the capacitive sensing pad 64, measures a third amplitude and a third phase, and calculates the capacitance and associated phase of the capacitive sensing pad 64 using the calculated sensitivity factors. As will be described more fully hereinbelow, the controller 48 compares this capacitance and associated phase with a threshold so as to discriminate a normally seated occupant from other seat occupancy conditions. If a normally seated occupant 44 is present, the restraint actuator 40 is actuated responsive to the detection of a crash by the crash sensor 46. Whereas FIG. 10*a* illustrates the microprocessor U2 and controller 48 as separate elements that communicate with one another, alternate arrangements are possible. For example, both may be combined in one controller, or the microprocessor may be adapted to sense the amplitude and phase measurements, calculate the capacitance of the capacitive sensing pad and adjust the associated phase measurement, and then output the capacitance value and associated phase measurement to the controller 48.

The capacitive sensing pad 64 comprising the at least one first electrode 26, mounted in the seat 14, is modeled as a first capacitance CS1 in parallel with a series combination of a second capacitance CS2 and a resistance RS, wherein the resistance RS is inversely related to the wetness of the seat. The capacitance of the electric field sensor 12 is dominated by CS1 for a dry seat, but becomes affected by CS2 and RS as the wetness of the seat increases. The values of capacitance for capacitors C1, CR1, and CR2 are adapted to maximize the dynamic range of the capacitance measurement over the range of expected capacitances of the electric field sensor 12.

The capacitance of the electric field sensor 12 can be also measured by other means of measuring capacitance, as for example given in the *Standard Handbook for Electrical Engineers* 12$^{th}$ edition, D. G. Fink and H. W. Beaty editors, McGraw Hill, 1987, pp. 3–57 through 3–65 or in Reference Data for Engineers: Radio, Electronics, Computer, and Communications 7$^{th}$ edition, E. C. Jordon editor in chief, Howard W. Sams, 1985, pp. 12-3 through 12—12, both included herein by reference.

Figure 11A:
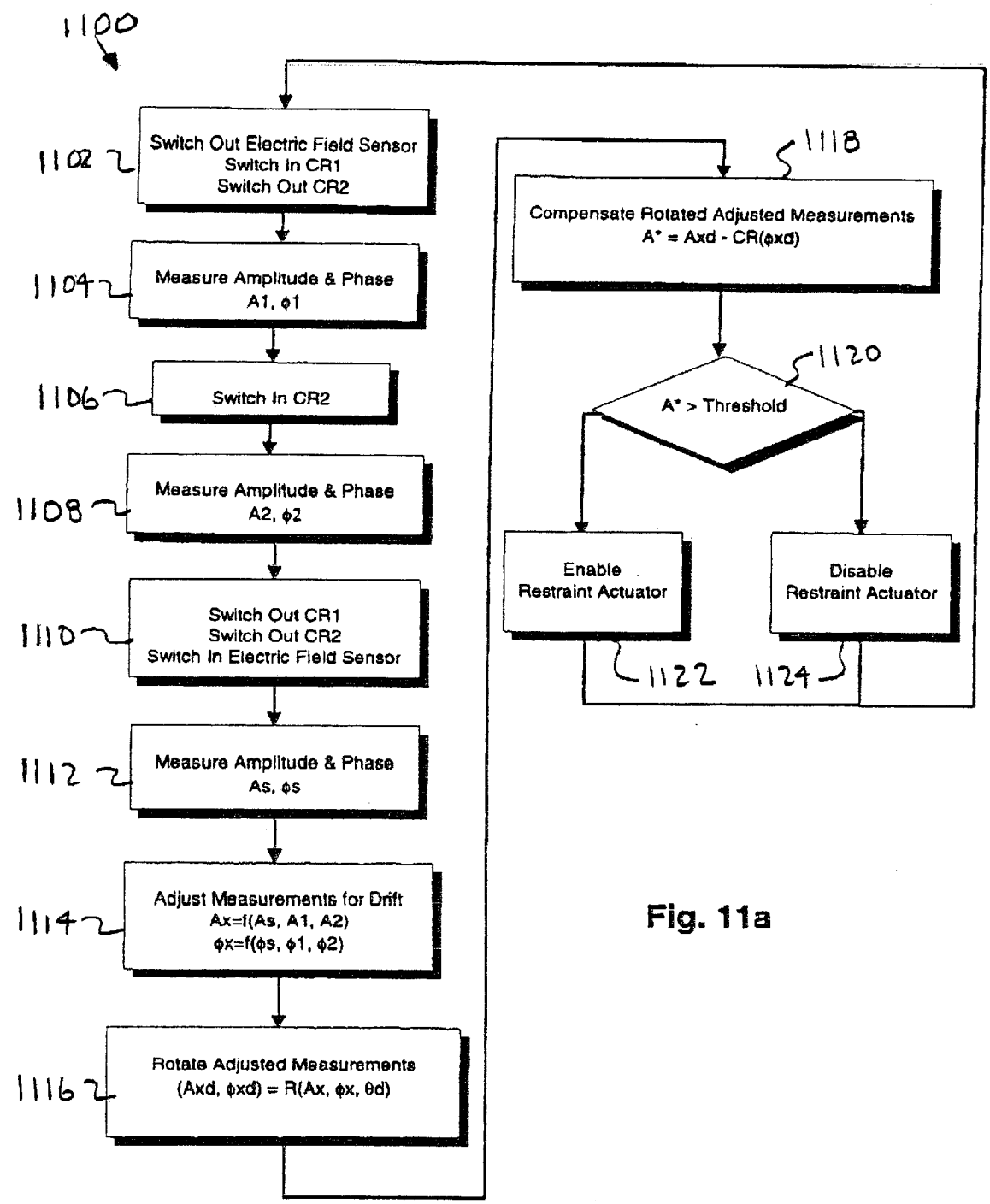
FIG. 11a illustrates a flow chart of the processing of amplitude and phase measurements from an electric field sensor.

Referring to FIGS. 11a–c, in an exemplary algorithm 1100 for distinguishing the child seat/empty seat situations from the adult situations, with reference to the sensing circuit 38 illustrated in FIG. 10, in step (1102) the first reference capacitor CR1 is switched to the first reference node 1010 and the associated first amplitude and phase (A1, φ1) are measured in step (1104) from the respective amplitude 1026 and phase 1038 signals. Then, in step (1106), the second reference capacitor CR2 is switched into the first reference node and the associated second amplitude and phase (A2, φ2) are measured in step (1108) from the respective amplitude 1026 and phase 1038 signals. Then, in step (1110), the first CR1 second CR2 reference capacitors are switched off the first reference node 1010, the electric field sensor 12 is switched into first reference node 1010, and the associated sensor amplitude and phase (As, φs) are measured in step (1112) from the respective amplitude 1026 and phase 1038 signals. In step (1114), the sensor amplitude and phase measurements (As, φs) are then adjusted for drift and other variations in the sensing circuit 38 so as to provide adjusted sensor amplitude and phase measurements (Ax, φx). For example, the amplitude is scaled in accordance with the amplitude sensitivity factor so that the difference between the first and second amplitudes is adjusted to an associated predetermined value, for example the capacitance of the second reference capacitor CR2. Similarly, the phase is scaled in accordance with the phase sensitivity factor so that the difference between the first and second phases is adjusted to an associated predetermined value.

In step (1116), the adjusted amplitude and phase measurements are rotated by an angle θd corresponding to the variation in phase with amplitude for dry seat conditions, which will be described more fully hereinbelow. This rotation substantially eliminates the phase variation in dry seat measurements. The corresponding rotated adjusted phase is referred to herein as rotated phase.

In step (1118), the rotated adjusted amplitude measurements are compensated by a compensation function—described more fully hereinbelow—that depends upon rotated phase and which compensates for the wetness of the seat 14. The value of the compensation function is subtracted from the rotated adjusted phase so as to provide a compensated amplitude A*, which in step (1120) is compared with a threshold, for example, after filtering the compensated amplitude A* over several samples. If the compensated amplitude A* is greater than the threshold, then an occupant of sufficient size is assumed to be seated on the seat 14, and the restraint actuator 40 is enabled in step (1122). If the compensated amplitude A* is less than the threshold, then the seat 14 is either assumed to be empty or contains, for example, a rear facing infant seat 202, and the restraint actuator 40 is enabled in step (1124).

Referring to FIGS. 11b and 12a, illustrating a process 1130 of predetermining the angle θd, in step (1132) the amplitude 1026 and phase 1038 signals are measured for a plurality and variety of dry seat conditions, for example with various seat occupancy scenarios including an empty seat, and in step (1134) these measurements are adjusted for drift, for example in accordance with steps (1102) through (1114) consecutively, in FIG. 11a. Referring to FIG. 12a, the adjusted measurements are plotted in phase amplitude space, and in step (1136), the angle θd is calculated as that angle necessary to rotate file best it line so as to remove the phase variation in the associated rotated phase of the dry seat measurements.

Figure 12B:
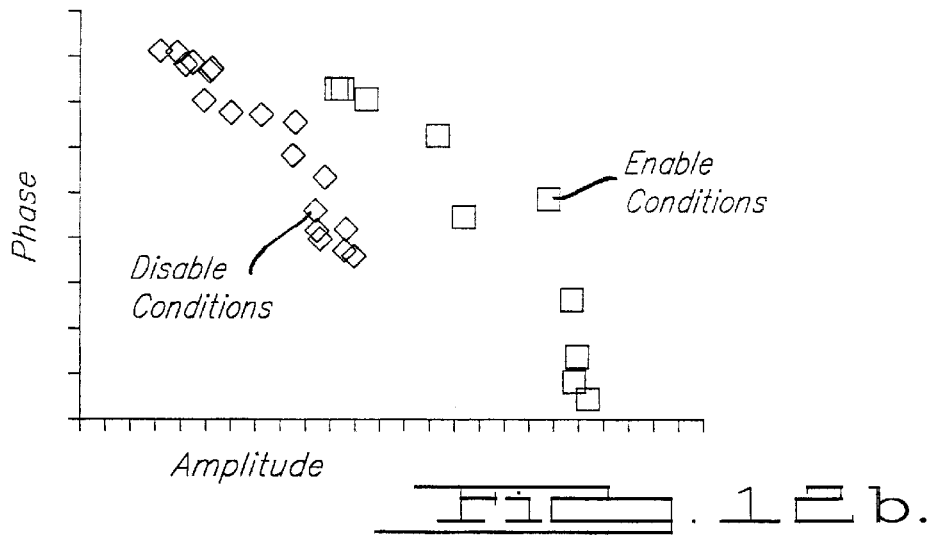
FIG. 12b is a plot of phase vs. amplitude for measurements from an electric field sensor for a variety of seat occupancy conditions and a variety of seat wetness conditions.
Figure 12C:
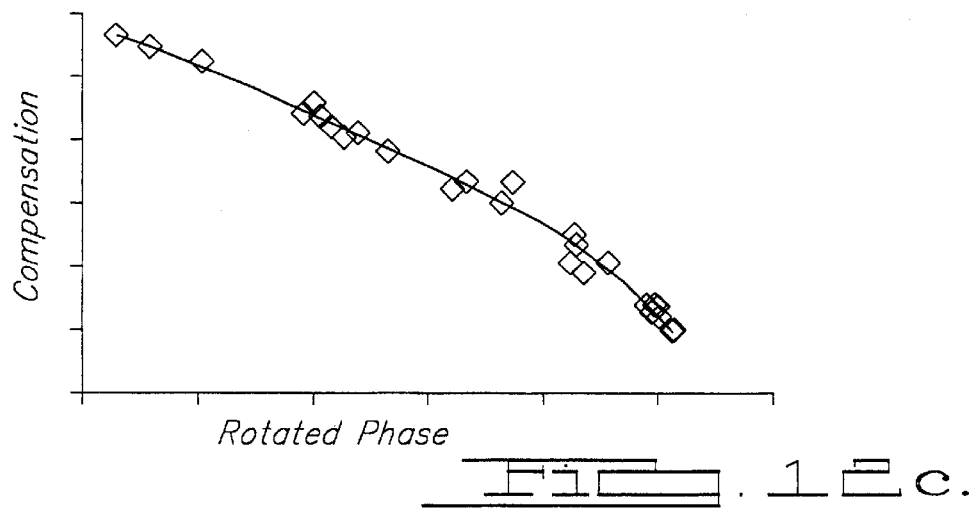
FIG. 12c is a plot of a compensation function.
Figure 12D:
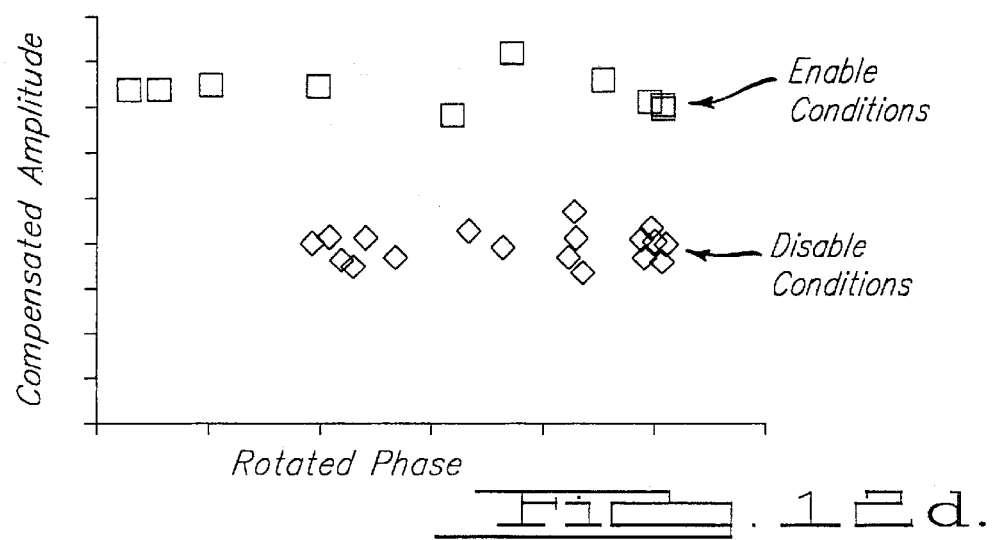
FIG. 12d is a plot of compensated amplitude as a function of rotated phase for the measurements of FIG. 12b.

Referring to FIGS. 11c and 12b, illustrating a process 1140 of predetermining the compensation function used in step (1118) of FIG. 11a, the amplitude and phase for a plurality and variety of seating conditions are measured in step (1142). These seating conditions are selected to cover the expected range of operation of the occupant sensor 10, including, for example, varying degrees of seat wetness, occupant size, occupant type, child/infant seats, and an empty seat. In step (1144) these measurements are adjusted for drift, for example in accordance with steps (1102) through (1114) consecutively, in FIG. 11a. Then in step (1146), the adjusted measurements are rotated in accordance with step (1116) of FIG. 11a. Then, in step (1148), the compensation function is calculated as the amplitude compensation necessary to distinguish those seating conditions for which the restraint actuator 40 should be enabled from those for which the restraint actuator 40 should be disabled, as illustrated in FIGS. 12c and 12d.

Figure 13A:
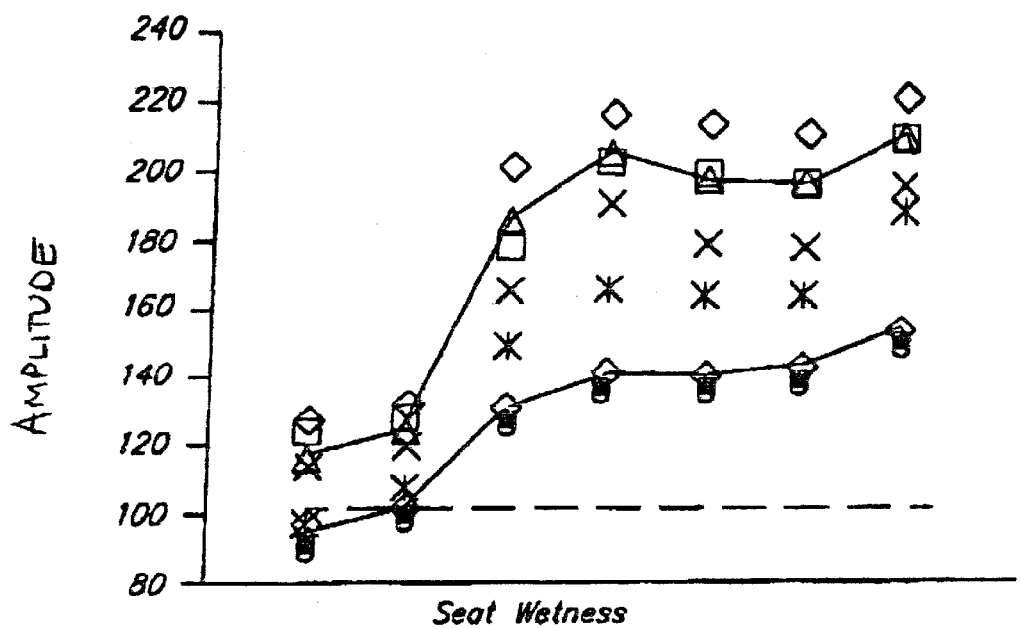
FIG. 13a illustrates a plurality of capacitance measurements from an electric field sensor, plotted as a function of wetness for a variety of seat occupancy scenarios.
Figure 13B:
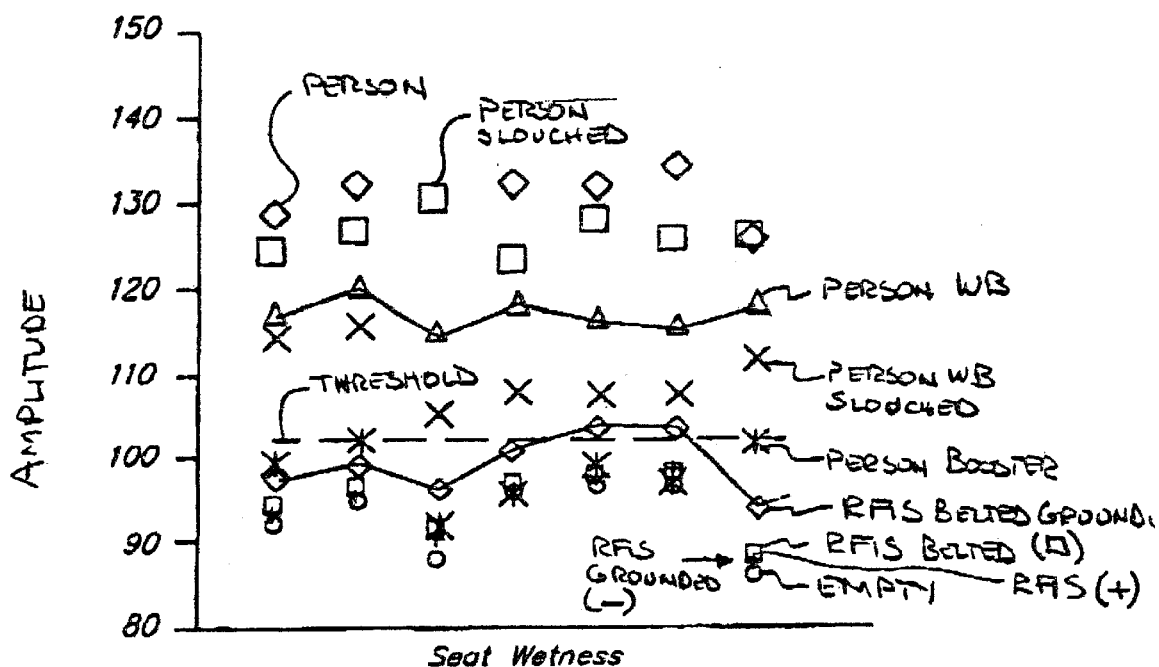
FIG. 13b illustrates a plurality of capacitance measurements from an electric field sensor, compensated in accordance with the process of FIG. 11a, plotted as a function of wetness for a variety of seat occupancy scenarios.

The compensation function is derived by empirically identifying the error induced by the wet seat for various person and child seat cases. The calculated compensation may not always be perfect, but can be close enough to make the correct enable/disable decision during most situations. The results of applying the compensation function to a variety of measurements for a variety of wetness conditions are illustrated in FIGS. 13a–b, respectively illustrating uncompensated and compensated measurements for a variety of seating conditions, wherein wetness increases from left to right on the associated plots, with the minimum wetness condition being a dry condition, and each successive increase in wetness corresponding to the effect of adding a quantity of water to the seat.

The ground plane 500 in the electric field sensor 12 illustrated in FIG. 5 can increase the sensitivity of the electric field sensor 12 to localized packets of water proximate to the electrode/ground plane gap of the electric field sensor 12, notwithstanding its benefit in reducing the sensitivity of the electric field sensor 12 to objects placed proximate thereto. This increased localized sensitivity can cause the compensation method to be incorrect with some distributions of water on or in the seat, and accordingly, the ground plane 500 was not incorporated in the electric field sensor 12 used to obtain the results of FIGS. 12b–d.

Whereas the compensation for wetness has been illustrated in FIGS. 11a–c, 12a–d and 13a–b for a process by which the measurements are adjusted to compensate for seat wetness, alternately the threshold may be compensated instead of compensating the measurements.

The consistency of the results is improved if the seat frame is consistently grounded, for example by connecting the seat frame directly to the circuit ground, as would be the case in a vehicle with the seat bolted to the floor pan, which is typically part of the vehicle chassis ground. The grounds of the seat are preferably as far away as possible from the sensor electrode so that the resistance to the ground from the sensor electrode is relatively high. If the ground is relatively close to the sensor, then a relatively small amount of water between the sensor and the ground can create a relatively large effect on the capacitance measurement. Because the compensation for the water on the seat is not perfect, better results are provided with smaller required corrections.

Additional information can be gained by measuring amplitude and phase information at several different frequencies, for example by varying the frequency of the oscillator from one measurement to another. The variation of amplitude as a function of frequency can be used to gain information about how to best compensate for the effects of the water on the seat. If the seat is dry, the calculated impedance to ground from the sensor is relatively invariant with respect to frequency. However, if there is enough water to influence the impedance, the measured impedance to ground tends to decrease at lower frequencies. Accordingly, the slope of the amplitude versus frequency curve—or another parameter derived from the amplitude/frequency curve—and the amplitude at the highest measured frequency can be used in place of the phase and the amplitude within the above-described exemplary algorithm in order to compensate for the liquid's effect on the wet seat. The phase shift as a function of frequency can also be used to compensate for the liquid's effect on the impedance from the sensor to ground.

Figure 14A:
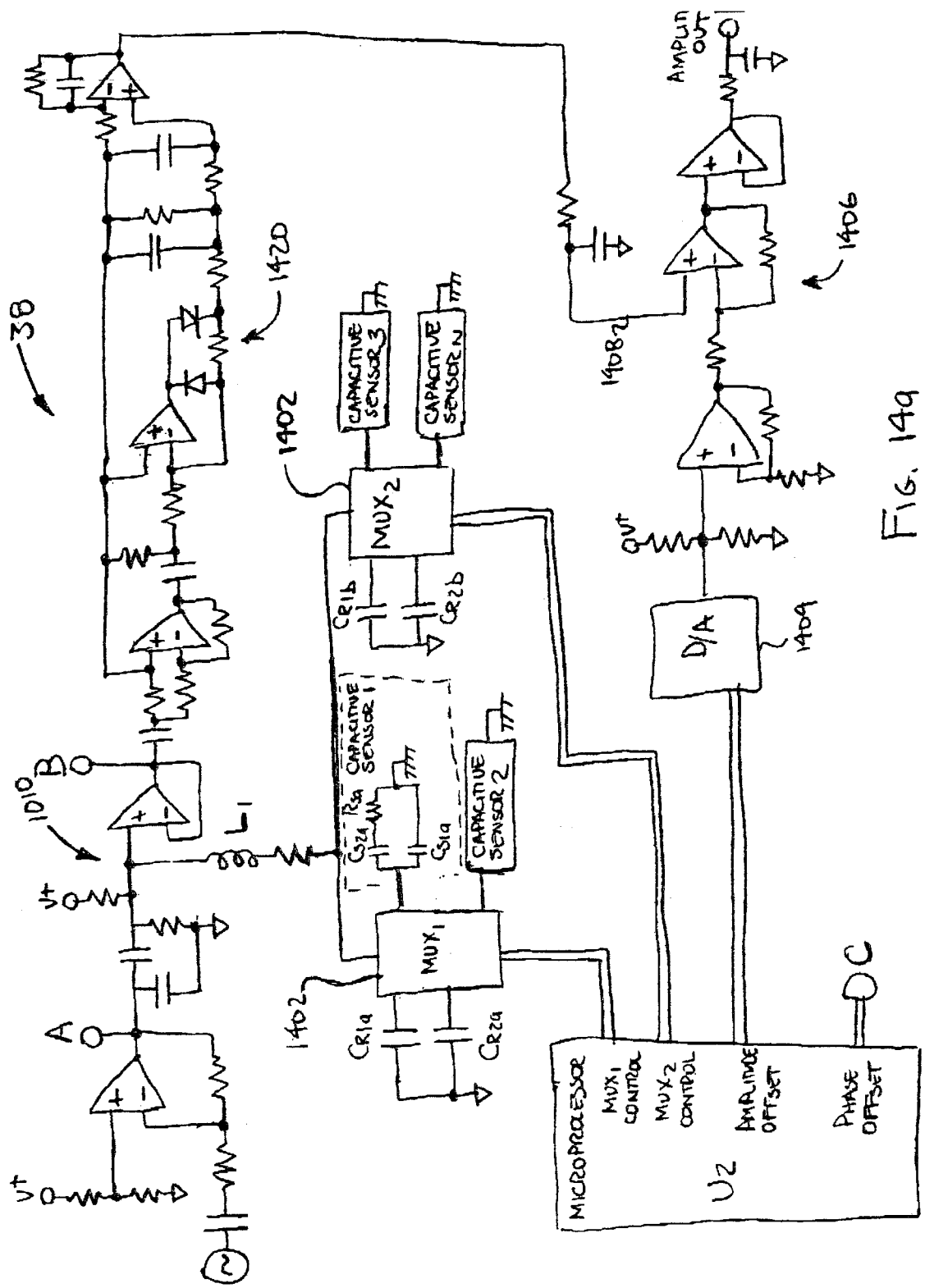
Figure 18:
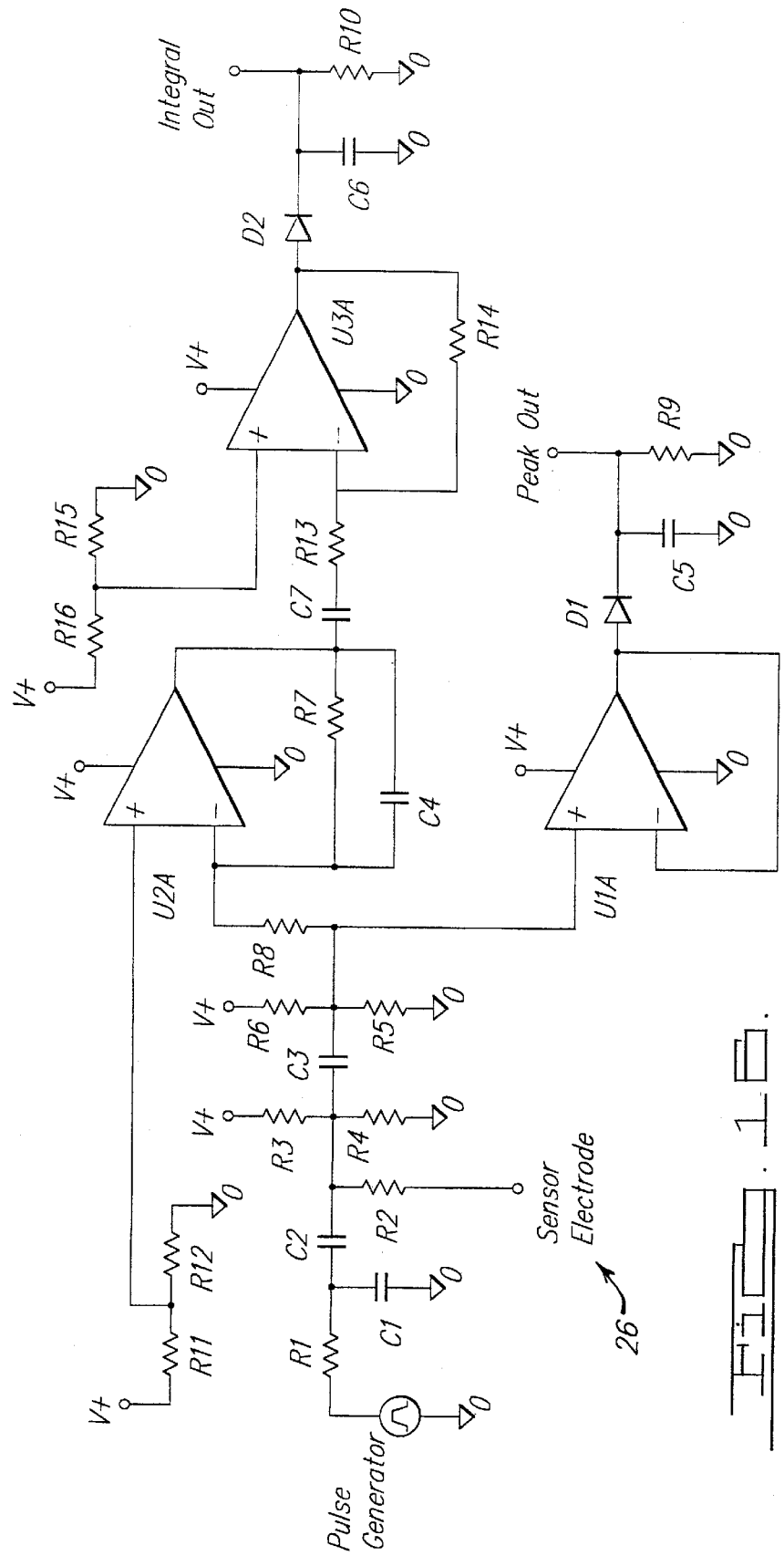

FIGS. 14a and 14b illustrate several other embodiments for various aspects of the sensing circuit 38, wherein FIG. 14a illustrates an amplitude sensing portion of the sensing circuit 38 and FIG. 14b illustrates a phase sensing portion of the sensing circuit 38.

For example, the elements to be sensed at the first node 1010 can be coupled via an analog demultiplexor 1402, such as a CD4051 from Texas Instruments, wherein under control of the microprocessor U2, the elements to be sensed are coupled, one element at a time, to the first node 1010 by the analog demultiplexor 1402. For example, first CR1a and second CR2a reference capacitors and a capacitive sensor are each operatively connected to distinct analog inputs of the analog demultiplexor 1402, and are operatively connected—mutually exclusively—to the first node 1010 by the analog demultiplexor 1402. Accordingly, with this arrangement, the calibration process differs from that illustrated in FIGS. 10a–b for which two reference capacitors can be simultaneously operatively connected to the first node 1010. A plurality of analog demultiplexors 1402 may be used if more analog channels are required, in which case a separate set of reference capacitors, for example CR1b and CR2b, may be used with each separate analog demultiplexor 1402 to compensate for variations amongst the various analog demultiplexors 1402.

As another example of an alternate embodiment, an inductor L1 can be placed between the sensing node 1010 and the elements to be sensed in order to reduce the effects of electromagnetic interference.

As yet another example of an alternate embodiment, a D/A converter 1404 under control of the microprocessor U2 may be used to cancel offsets in the associated amplitude signal, wherein the output from the D/A converter 1404 is operatively connected to an inverting amplifier 1406, and is subtracted from the filtered detected amplitude signal 1408. Similarly, a D/A converter 1410 under control of the microprocessor U2 may be used to cancel offsets in the associated phase signal, wherein the output from the D/A converter 1410 is operatively connected to an inverting amplifier 1412, and is subtracted from the filtered detected phase signal 1414. By canceling the respective offsets in the amplitude and phase signals, the associated circuit gains can be increased so as to increase the dynamic range of the respective signals.

As yet another example of an alternate embodiment, a logical OR gate 1416 may be used instead of an exclusive OR gate to form the third square wave signal 1418 representing the detected phase signal. The logical OR gate 1416 provides an inherent DC bias to the output signal, whereby for square wave input signals of 50 percent duty cycle, the output of the logical OR gate 1416 varies from 50 percent to full scale as phase difference varies from 0 to 180 degrees.

As yet another example of an alternate embodiment, a super diode detection circuit 1420 may be used for detecting the signal amplitude.

Another method for making a capacitance measurement and a similar wet seat correction is to use a peak detector and integrator to identify characteristics of an isolated square pulse, as illustrated by the circuit shown in FIG. 15. The pulse generator sends a square wave pulse through a low pass filter which slows the rise of the pulse in order to reduce ringing that would otherwise result from the inductance of the sensor. When a pulse is sent into the bridge circuit comprising capacitor C10 and the at least one first electrode 26, the amplitude and shape of the pulse at the sensing node depends on the sensor's impedance to ground. Resistor R17 is a relatively small impedance (compared to either capacitor C10 or the sensor) and reduces the ringing after the rising edge. If the pulse length is short and the sensor is an ideal capacitor to ground, then the output will have essentially the same shape as the input pulse, but a lower amplitude. If the sensor has a complex impedance then the shape of the output pulse will vary depending on the components of the impedance. Conductance from the sensor to ground, as a result of $R_{SHUNT}$, causes a decreased amplitude and a decay of the voltage to ground. This decay can be used to identify the affect of water on the seat.

Figure 17:
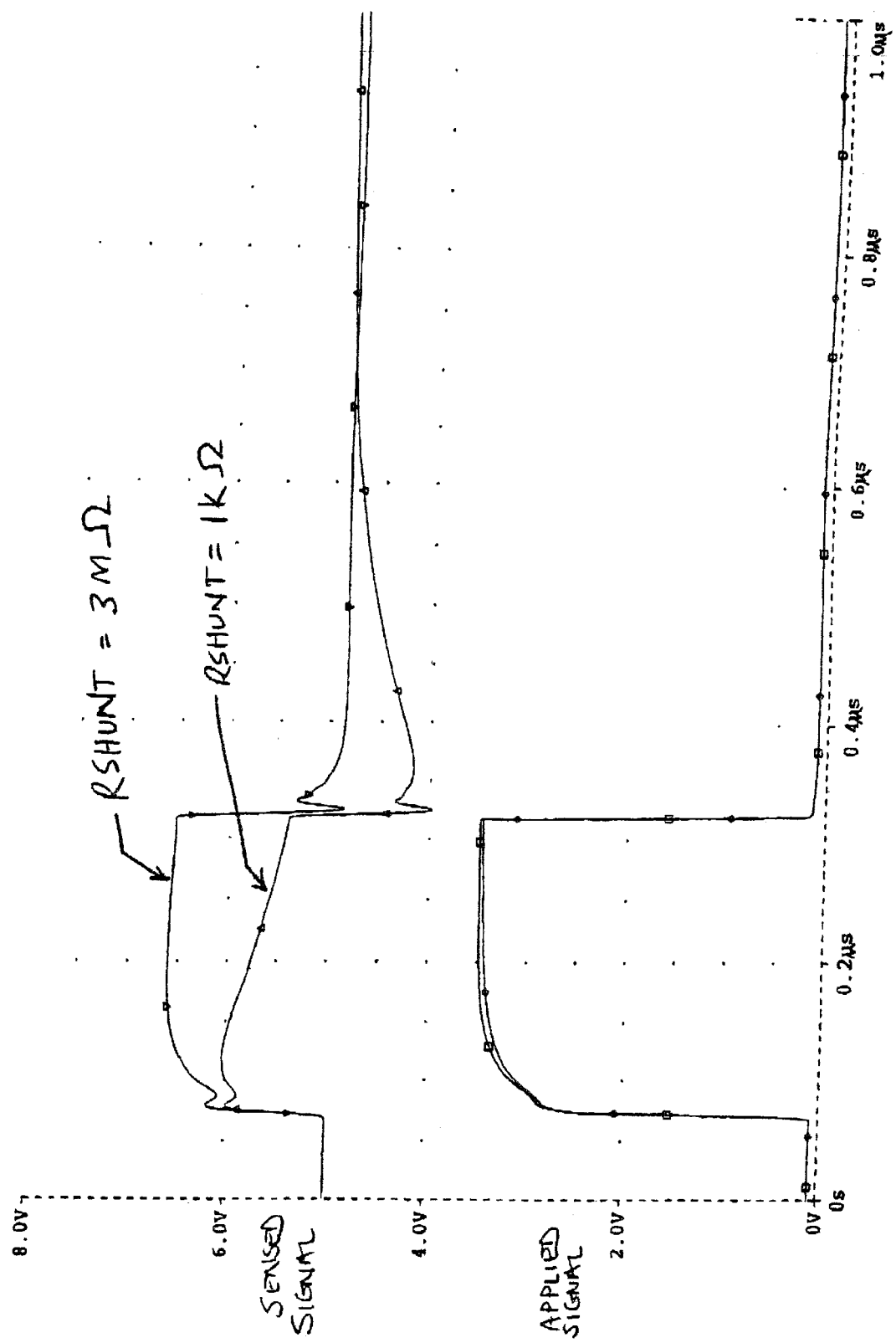
FIG. 17 illustrates signals in the circuit of FIG. 16 for two different levels of shunt resistance of the electric field sensor.

Characteristics of the output pulse, such as the peak and the integral, can be used to identify conductance to ground from the sensor, as illustrated by the circuit shown in FIG. 16. The input pulse is a TTL level square pulse that is filtered to increase the rise time of the leading positive edge. The setting of the rise time is a compromise between immunity to the wet seat condition and ringing in the signal as a result of the inductance at the sensor. Resistors can be placed in the measurement circuit to reduce this ringing. FIG. 17 illustrates the signal into the integrator and peak detector, wherein it can be seen that the pulse shape varies when there is a relatively low resistance to ground from the sensor. The algorithm used to compensate for the wet seat is essentially the same as the above-described exemplary algorithm, but with the peak amplitude and the integral respectively used instead of the amplitude and the phase.

Another method of measuring capacitance and compensating for the wet seat condition is to use a charge transfer method of making measurements, with several different charge/transfer times. The measurements using the longer charge/transfer times tend to be influenced more heavily by the water in the seat. A measure of the influence by the water on the seat can be made by making several measurements with several different charge transfer times. For example, the slope of the relationship between the capacitance measured and the charge/transfer times can be used to assess the influence the water has on the capacitance measurement, wherein the measurement that is closest to the correct measurement would be the measurement using the shortest charge/transfer times. The associated correction algorithm would be similar to the above-described exemplary algorithm, but the shortest charge/transfer time measurement and the slope (or another characteristic of the various measurements) of the several charge/transfer time measurements respectively used instead of the amplitude and phase.

The electric field sensor 12 in the seat bottom moves with the seat bottom, and is not substantially affected by the associated seat back angle or seat position, which accordingly do not affect the air bag deployment decision. Moreover, typical objects, such as towels, that are placed under child seats for stabilization thereof do not substantially affect the sensor measurement, or accordingly, the associated air bag deployment decision.

Whereas the electric field sensor 12 as been illustrated herein as located in the seat bottom for detecting the presence of a normally seated occupant, or for distinguishing a normally seated occupant from other seat occupancy scenarios, this application is not considered to limiting to the instant invention. For example, the electric field sensor 12 described herein can be used in the seat back to identify whether an occupant is against the seat back or near to the side air bag, or to measure the height of an occupant against the seat back. Moreover, the electric field sensor 12 can be incorporated in an occupant detection in combination with other sensors—for example a ranging sensor, a seat weight sensor or an electric field receiver in the instrument panel— as disclosed in patent applications incorporated by reference herein, which also disclose associated control logic for controlling an associated safety restraint system, for example, an air bag inflator. Furthermore, the electric field sensor 12 can incorporate various electrode configurations, and various signal topologies therewith, as also disclosed in patent applications incorporated by reference herein.

The electric field sensor 12 can be used alone or in combination with other sensors to control the activation of a safety restraint system, particularly to disable the activation of a safety restraint system if the capacitance from the sensor is not sufficiently great to indicate the presence of a normally seated adult.

While specific embodiments have been described in detail, those with ordinary skill in the art will appreciate that various modifications and alternatives to those details could be developed in light of the overall teachings of the disclosure. Accordingly, the particular arrangements disclosed are meant to be illustrative only and not limiting as to the scope of the invention, which is to be given the full breadth of the appended claims and any and all equivalents thereof.

What is claimed is:

1. An occupant sensor, comprising:
   a. an electric field sensor comprising at least one first electrode mountable within a vehicle seat; and
   b. a sensing circuit operatively coupled to at least one said first electrode, wherein said sensing circuit applies an applied signal to said at least one said first electrode, said applied signal comprises a first oscillating signal, said sensing circuit generates a first signal responsive to at least one electric-field-influencing property of an object proximate to said electric field sensor, said first oscillating signal comprises at least one frequency, said at least one frequency comprises a plurality of frequencies, and at least one of said at least one frequency is at most weakly responsive to a wetting condition of said vehicle seat by a liquid.

2. An occupant sensor as recited in claim 1, wherein at least one of said at least one frequency is greater than 400 kilohertz.

3. An occupant sensor as recited in claim 1, wherein at least one of said at least one frequency is adapted so that a liquid proximate to said at least one first electrode reacts to a change in an electric field proximate to said at least one first electrode in a time period greater than a threshold.

4. An occupant sensor as recited in claim 3, wherein said threshold is 200 nanoseconds.

5. An occupant sensor as recited in claim 3, wherein said frequency is greater than 800 kilohertz.

6. An occupant sensor as recited in claim 1, wherein said plurality of frequencies comprises a first and second frequency, said first frequency is less than 100 kilohertz, and said second frequency is greater than 800 kilohertz.

7. An occupant sensor as recited in claim 1, wherein said sensing circuit is responsive to a capacitance of at least one said first electrode with respect to a circuit ground.

8. An occupant sensor, comprising:
   a. an electric field sensor comprising at least one first electrode mountable within a vehicle seat; and
   b. a sensing circuit operatively coupled to at least one said first electrode, wherein said sensing circuit applies an applied signal to said at least one said first electrode, said applied signal comprises a first oscillating signal, said sensing circuit generates a first signal responsive to at least one electric-field-influencing property of an object proximate to said electric field sensor, said first oscillating signal comprises at least one frequency, at least one of said at least one frequency is at most weakly responsive to a wetting condition of said vehicle seat by a liquid, said sensing circuit is responsive to a capacitance of at least one said first electrode with respect to a circuit ground, and said sensing circuit is responsive to a resistance of at least one said first electrode with respect to said circuit ground.

9. An occupant sensor as recited in claim 8, wherein said resistance is responsive to said wetting condition of said vehicle seat.

10. An occupant sensor, comprising:
    a. an electric field sensor comprising at least one first electrode mountable within a vehicle seat; and
    b. a sensing circuit operatively coupled to at least one said first electrode, wherein said sensing circuit applies an applied signal to said at least one said first electrode, said applied signal comprises a first oscillating signal, said sensing circuit generates a first signal responsive to at least one electric-field-influencing property of an object proximate to said electric field sensor, said applied signal and said sensing circuit are adapted so that said sensing circuit is responsive to a wetting condition of said vehicle seat, said first oscillating signal comprises at least one pulse, and at least one said pulse is adapted so that a liquid proximate to said at least one first electrode reacts to a change in an electric field proximate to said at least one first electrode in a time period greater than a threshold.

11. An occupant sensor as recited in claim 10, wherein said threshold is 200 nanoseconds.

12. An occupant sensor as recited in claim 10, wherein said at least one pulse has a pulse width less than 250 nanoseconds.

13. An occupant sensor as recited in claim 10, wherein said first oscillating signal comprises a plurality of pulses.

14. An occupant sensor as recited in claim 13, wherein each of said plurality of pulses has a pulse width, at least two of said plurality of pulses have different pulse widths, and at least one said pulse has a pulse width less than 250 nanoseconds.

15. An occupant sensor, comprising:
    a. an electric field sensor comprising at least one first electrode mountable within a vehicle seat; and
    b. a sensing circuit operatively coupled to at least one said first electrode, wherein said sensing circuit applies an applied signal to said at least one said first electrode, said applied signal comprises a first oscillating signal, said sensing circuit generates a first signal responsive to at least one electric-field-influencing property of an object proximate to said electric field sensor, said first oscillating signal comprises at least one frequency, and at least one of said at least one frequency is at most weakly responsive to a wetting condition of said vehicle seat by a liquid, wherein said sensing circuit comprises:
  i) a source of an oscillatory signal;
  ii) a voltage divider comprising:
    (a) at least one capacitor, wherein said at least one capacitor is operatively coupled to said source of an oscillatory signal; and
    (b) a resistor having a resistance, wherein said resistor is operatively coupled to said at least one capacitor at a first node and to a circuit ground, and at least one said first electrode is operatively coupled to said first node;
  iii) a phase detector operatively coupled to said first node for detecting a phase difference comprising difference between a phase of said oscillatory signal and a phase of a signal at said first node, wherein said phase difference is substantially constant when said vehicle seat is substantially dry; and
  iv) a discriminator operatively coupled to said phase detector, wherein said discriminator comprises a threshold responsive to said difference in phase and at least one of said threshold and said phase difference are adapted to compensate for a wetting of said vehicle seat.

16. An occupant sensor as recited in claim 15, wherein said resistance is substantially higher than an impedance of said at least one electrode with respect to a circuit ground at a frequency of said oscillatory signal.

17. An occupant sensor as recited in claim 15, wherein a first signal at said first node is responsive to said oscillatory signal, to said voltage divider, and to an impedance of at least one said first electrode with respect to said circuit ground, said impedance is substantially capacitive when said vehicle seat is substantially dry, and said impedance is also resistive when said vehicle seat is wetted by a liquid.

18. An occupant sensor as recited in claim 15, further comprising a voltage follower having an input and an output, wherein said input is operatively coupled to said first node, and said phase detector is operatively coupled to said first node through said voltage follower.

19. An occupant sensor as recited in claim 15, wherein said phase detector further comprises a filter.

20. An occupant sensor, comprising:
  a. an electric field sensor comprising at least one first electrode mountable within a vehicle seat; and
  b. a sensing circuit operatively coupled to at least one said first electrode, wherein said sensing circuit applies an applied signal to said at least one said first electrode, said applied signal comprises a first oscillating signal, said sensing circuit generates a first signal responsive to at least one electric-field-influencing property of an object proximate to said electric field sensor, said first oscillating signal comprises at least one frequency, and at least one of said at least one frequency is at most weakly responsive to a wetting condition of said vehicle seat by a liquid, wherein said sensing circuit comprises.
  i) a source of an oscillatory signal;
  ii) a voltage divider comprising:
    (c) at least one capacitor, wherein said at least one capacitor is operatively coupled to said source of an oscillatory signal; and
    (d) a resistor having a resistance, wherein said resistor is operatively coupled to said at least one capacitor at a first node and to a circuit ground, and at least one said first electrode is operatively coupled to said first node;
  iii) an amplitude detector operatively coupled to said first node for detecting for detecting an amplitude of said signal at said first node, wherein said amplitude of said first signal is responsive to a wetting condition of said vehicle seat, whereby said amplitude is decreased responsive to said liquid; and
  iv) a discriminator operatively coupled to said amplitude detector, wherein said discriminator comprises a threshold responsive to said amplitude and at least one of said threshold and said amplitude are adapted to compensate for a wetting of said vehicle seat.

21. An occupant sensor as recited in claim 20, wherein said resistance is substantially higher than an impedance of said at least one electrode with respect to a circuit ground at a frequency of said oscillatory signal.

22. An occupant sensor as recited in claim 20, wherein a first signal at said first node is responsive to said oscillatory signal, to said voltage divider, and to an impedance of at least one said first electrode with respect to said circuit ground, said impedance is substantially capacitive when said vehicle seat is substantially dry, and said impedance is capacitvie reactive when said vehicle seat is wetted by a liquid.

23. An occupant sensor as recited in claim 20, further comprising a voltage follower having an input and an output, wherein said input is operatively coupled to said first node, and said phase detector is operatively coupled to said first node through said voltage follower.

24. An occupant sensor as recited in claim 20, wherein said amplitude detector further comprises a filter.

25. An occupant sensor as recited in claim 20, wherein said sensing circuit further comprises:
  a. a phase detector operatively coupled to said first node for detecting a phase difference comprising difference between a phase of said oscillatory signal and a phase of a signal at said first node, wherein said discriminator is operatively coupled to said phase detector, and said threshold is responsive to said difference in phase; and
  b. a processor operatively coupled to said phase detector and to said amplitude detector, wherein said processor generates a first measure for said first frequency having at least one component selected from an output of said phase detector, an output of said amplitude detector, and a capacitance of at least one said first electrode with respect to said circuit ground.

26. An occupant sensor as recited in claim 25, wherein said resistance is substantially higher than an impedance of at least one said first electrode with respect to circuit ground at a frequency of said oscillatory signal.

27. An occupant sensor as recited in claim 25, wherein a first signal at said first node is responsive to said oscillatory signal, to said voltage divider, and to an impedance of at least one said first electrode with respect to said circuit ground, said impedance is substantially capacitive when said vehicle seat is substantially dry, and said impedance is also resistive when said vehicle seat is wetted by a liquid.

28. An occupant sensor as recited in claim 25, further comprising a voltage follower having an input and an output, wherein said input is operatively coupled to said first node, and said phase detector is operatively coupled to said first node through said voltage follower.

29. An occupant sensor as recited in claim 25, wherein said phase detector further comprises a first filter, and said amplitude detector further comprises a second filter.

30. An occupant sensor as recited in claim 25, wherein said processor generates a second measure for said second frequency having components selected from an output of said phase detector, an output of said amplitude detector, and a capacitance of at least one said first electrode with respect to said circuit ground, and said processor compares said first measure with said second measure so as to discriminate a type of object on said vehicle seat and a condition of said vehicle seat.

31. An occupant sensor as recited in claim 30, wherein said processor is operatively coupled to a safety restraint system and said safety restraint system is enabled when at least one of said first and second measures exceeds a threshold.

32. An occupant sensor as recited in claim 30, wherein said first and second measures are measures of a capacitance of at least one said first electrode, and said sensing circuit adapts at least one of said threshold, said first measure, and said second measure responsive to a detected wetness of said vehicle seat, whereby said first measure is greater than said second measure when said vehicle seat is wetted by a liquid.

33. An occupant sensor as recited in claim 32, wherein said threshold is compared with a capacitance of at least one said first electrode.

34. An occupant sensor as recited in claim 33, wherein said threshold is increased responsive to a detected wetness of said vehicle seat.

35. A method of sensing an occupant, comprising:
   a. placing at least one electrode within a seat of a motor vehicle;
   b. applying an oscillating signal to said at least one electrode;
   c. generating a second signal responsive to said at least one electrode;
   d. measuring an amplitude of said second signal;
   e. measuring a phase of said second signal relative to said oscillating signal;
   f. rotating said amplitude and phase in amplitude-phase space by an angle, so as to create a rotated amplitude and a rotated phase;
   g. compensating said rotated amplitude by a value responsive to said rotated phase so as to create a compensated rotated amplitude; and
   h. comparing said compensated rotated amplitude with a threshold.

36. A method of sensing an occupant as recited in claim 35, further comprising:
   a. applying said oscillating signal to a first capacitance;
   b. generating a third signal responsive to said first capacitance;
   c. measuring an amplitude of said third signal;
   d. measuring a phase of said third signal relative to said oscillating signal;
   e. applying said oscillating signal to a second capacitance;
   f. generating a fourth signal responsive to said first capacitance;
   g. measuring an amplitude of said fourth signal;
   h. measuring a phase of said fourth signal relative to said oscillating signal;
   i. adjusting said amplitude of said second signal responsive to said amplitude of said third signal and to said amplitude of said fourth signal;
   j. adjusting said phase of said second signal responsive to said phase of said third signal and to said phase of said fourth signal.

37. A method of sensing an occupant as recited in claim 35, wherein said angle is calculated from a plurality of measurements of amplitude and phase from at least one electrode in a seat for a plurality of seat occupancy scenarios for a dry said seat.

38. A method of sensing an occupant as recited in claim 35, wherein said step of compensating said rotated angle is responsive to a compensation function, and said compensation function is calculated from a plurality of measurements of amplitude and phase from at least one electrode in a seat for a plurality of seat occupancy scenarios and for a plurality of degrees of wetness of said seat.

39. A method of sensing an occupant as recited in claim 35, further comprising the operation of enabling a safety restraint system if said compensated rotated amplitude exceeds said threshold.

40. A method of sensing an occupant as recited in claim 35, further comprising the operation of disabling a safety restraint system if said compensated rotated amplitude is less than said threshold.

* * * * *